(12) United States Patent
Xiao et al.

(10) Patent No.: US 10,868,276 B2
(45) Date of Patent: Dec. 15, 2020

(54) DISPLAY PANEL, DISPLAY DEVICE, AND FABRICATION METHOD THEREOF

(71) Applicant: WUHAN TIANMA MICRO-ELECTRONICS CO., LTD., Wuhan (CN)

(72) Inventors: Ai Xiao, Wuhan (CN); Guofeng Zhang, Wuhan (CN); Tianqing Hu, Shanghai (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 75 days.

(21) Appl. No.: 16/226,096

(22) Filed: Dec. 19, 2018

(65) Prior Publication Data

US 2020/0106053 A1 Apr. 2, 2020

(30) Foreign Application Priority Data

Sep. 29, 2018 (CN) .......................... 2018 1 1152190

(51) Int. Cl.
*H01L 51/52* (2006.01)
*H01L 27/32* (2006.01)
(Continued)

(52) U.S. Cl.
CPC ...... *H01L 51/5268* (2013.01); *H01L 27/3246* (2013.01); *H01L 51/0005* (2013.01);
(Continued)

(58) Field of Classification Search
CPC .............. C23C 16/45565; C23C 16/24; H01L 51/5246; H01L 27/3216; H01L 27/326;
(Continued)

(56) References Cited

U.S. PATENT DOCUMENTS 7,534,730 B2 * 5/2009 Ozaki ................. H01L 21/0223
438/770
10,367,052 B2 * 7/2019 Zhang .................. G09G 3/3225
(Continued)

FOREIGN PATENT DOCUMENTS

CN 106601931 A 4/2017

*Primary Examiner* — Latanya N Crawford Eason
(74) *Attorney, Agent, or Firm* — Anova Law Group PLLC

(57) ABSTRACT

A display panel includes an array substrate, including a display region containing a plurality of display pixels and a border region; and a scattering layer, located on one side of the array substrate and including a scattering region. The plurality of display pixels includes a plurality of pixel rows extending along a first direction and a plurality of pixel columns extending along a second direction. The first direction and the second direction intersect each other. The border region includes an irregularly-shaped border. The plurality of display pixels includes a first plurality of display pixels adjacent to the irregularly-shaped border. The first plurality of display pixels is located in different pixel rows and different pixel columns. A plurality of scattering particles is disposed in the scattering region, and an orthogonal projection of the scattering region on the array substrate covers at least a portion of the first plurality of display pixels.

20 Claims, 26 Drawing Sheets

(51) Int. Cl.
*H01L 51/00* (2006.01)
*H01L 51/56* (2006.01)

(52) U.S. Cl.
CPC ...... *H01L 51/0076* (2013.01); *H01L 51/0097* (2013.01); *H01L 51/5237* (2013.01); *H01L 51/5284* (2013.01); *H01L 51/56* (2013.01)

(58) Field of Classification Search
CPC ......... H01L 51/5281; H01L 2251/5338; H01L 27/3246; H01L 27/3258; Y02E 10/549
See application file for complete search history.

(56) References Cited

U.S. PATENT DOCUMENTS

| | | | |
|---|---|---|---|
| 10,573,236 B1* | 2/2020 | Gao | G09G 3/3233 |
| 10,629,668 B1* | 4/2020 | Zhang | H01L 27/3265 |
| 2019/0005915 A1* | 1/2019 | Liu | G02F 1/13454 |
| 2019/0164510 A1* | 5/2019 | Fang | G02F 1/13306 |
| 2019/0187513 A1* | 6/2019 | Jin | G02F 1/13318 |
| 2019/0265824 A1* | 8/2019 | Abe | G06F 3/0416 |
| 2019/0371251 A1* | 12/2019 | Fan | G09G 3/3258 |
| 2019/0372054 A1* | 12/2019 | Li | H01L 27/3244 |
| 2020/0058242 A1* | 2/2020 | Liu | G09G 3/20 |

* cited by examiner

DISPLAY PANEL, DISPLAY DEVICE, AND FABRICATION METHOD THEREOF

CROSS-REFERENCES TO RELATED APPLICATIONS

This application claims the priority of Chinese patent application No. 201811152190.3, filed on Sep. 29, 2018, the entirety of which is incorporated herein by reference.

FIELD OF THE DISCLOSURE

The present disclosure generally relates to the field of display technology and, more particularly, relates to a display panel, a display device, and fabrication method thereof.

BACKGROUND

As display technology is widely used in smart wear and other portable electronic devices, there has been a diversified demand for the appearance of display panels, and thus irregularly-shaped display panels have appeared.

The main difference between an irregularly-shaped display panel and a regular display panel is that the display region of the irregularly-shaped display panel has a special non-rectangular shape, such as a circular shape, a ring shape, a diamond shape, etc. However, the pixel units in the display panel are mostly rectangular structures or other regularly shaped structures. Therefore, when applying the pixel units into an irregularly-shaped display panel, the pixel units and the irregularly-shaped border may not be able to completely match with each other in the region adjacent to the irregularly-shaped border of the display panel, which may cause the display region of the display panel adjacent to the irregularly-shaped border to exhibit a zigzag pattern during a display operation. Therefore, the pattern at the boundary may not be smooth, which may affect the display effect in the display region adjacent to the irregularly-shaped border.

Therefore, there is a need to provide a display panel, a display device, and a method for manufacturing the display panel for eliminating the zigzag display of the regularly shaped display panels. The disclosed display panel, display device, and fabrication method for the display panel are directed to solve one or more problems set forth above and other problems in the art.

BRIEF SUMMARY OF THE DISCLOSURE

One aspect of the present disclosure provides a display panel. The display panel includes an array substrate and a scattering layer. The array substrate includes a display region containing a plurality of display pixels, and a border region surrounding the display region. The plurality of display pixels includes a plurality of pixel rows extending along a first direction and a plurality of pixel columns extending along a second direction. The first direction and the second direction intersect each other. The border region includes an irregularly-shaped border. The plurality of display pixels includes a first plurality of display pixels adjacent to the irregularly-shaped border, and the first plurality of display pixels is located in different pixel rows and different pixel columns. The scattering layer is located on one side of the array substrate and including a scattering region. A plurality of scattering particles is disposed in the scattering region, and an orthogonal projection of the scattering region on the array substrate covers at least a portion of the first plurality of display pixels adjacent to the irregularly-shaped border.

Another aspect of the present disclosure provides a display device. The display device includes a display panel according to the present disclosure.

Another aspect of the present disclosure provides a fabrication method for a display panel. The fabrication method includes forming an array substrate, including a display region and a border region surrounding the display region, and forming a plurality of display pixels in the display region of the array substrate. The plurality of display pixels includes a plurality of pixel rows extending along a first direction and a plurality of pixel columns extending along a second direction. The first direction and the second direction intersect each other. The border region includes an irregularly-shaped border. The plurality of display pixels includes a first plurality of display pixels adjacent to the irregularly-shaped border, and the first plurality of display pixels is located in different pixel rows and different pixel columns. The fabrication method also includes forming a scattering layer including a scattering region on one side of the array substrate. A plurality of scattering particles is disposed in the scattering region, and an orthogonal projection of the scattering region on the array substrate covers at least a portion of the first plurality of display pixels adjacent to the irregularly-shaped border.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Various exemplary embodiments of the present disclosure will now be described in detail with reference to the accompanying drawings. It should be noted that the relative arrangement of the components and steps, numerical expressions and numerical values set forth in the embodiments are not intended to limit the scope of the present disclosure. The following description of the at least one exemplary embodiment is merely illustrative, and by no means can be considered as limitations for the application or use of the present disclosure.

It should be noted that techniques, methods, and apparatuses known to those of ordinary skill in the relevant art may not be discussed in detail, but where appropriate, the techniques, methods, and apparatuses should be considered as part of the specification.

In all of the examples shown and discussed herein, any specific values should be considered as illustrative only and not as a limitation. Therefore, other examples of exemplary embodiments may have different values.

It should be noted that similar reference numbers and letters indicate similar items in subsequent figures, and therefore, once an item is defined in a figure, it is not required to be further discussed or defined in the subsequent figures.

Figure 1:
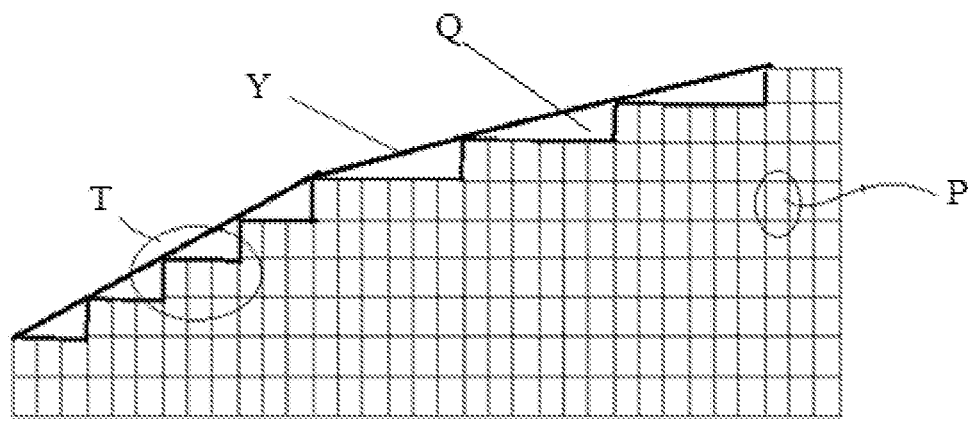
FIG. 1 illustrates a schematic view of a portion of pixels of an irregularly-shaped display panel.

FIG. 1 illustrates a schematic view of a portion of pixel units of an irregularly-shaped display panel. Referring to FIG. 1, in order to accommodate to an irregularly-shaped border Y of an irregularly-shaped display panel, a portion of the pixels P adjacent to the irregularly-shaped border Y is removed, resulting in a plurality of step regions T formed in the display region adjacent to the irregularly-shaped border Y. Complete pixels may not be disposed in a region Q located between the irregularly-shaped border Y and the plurality of step regions T, and the region Q may be blocked by a black matrix (BM). During a display operation, the pixels P located in the plurality of step regions T are lightened normally, while the BM in the region Q are almost opaque with nearly zero brightness. As such, the contrast in the brightness between the plurality of step regions T and the region Q is significant, such that a zigzag pattern may be formed. Therefore, during a display operation, the pattern at the irregularly-shaped border Y is not smooth, which degrades the display effect of the display panel. For example, a portion of the display region in the display panel may be hollow in order to set a camera or an earpiece, and the hollowed portion may has a shape of, e.g. a chamfered rectangle, a circle, an ellipse, etc., such that the display region has an irregularly-shaped border. In another example, for a display panel having a chamfered (i.e., corner rounded) rectangular shape, a circular shape, a ring shape, or any other non-rectangular shape, zigzag patterns can also appear on the display panel.

According to the disclosed display panel and display device, by disposing a scattering region on one side of the array substrate, the orthogonal projection of the scattering region on the array substrate covers at least a portion of the display pixels adjacent to the irregularly-shaped border, and thus when light emitted from the display region adjacent to the irregularly-shaped border is scattered by the scattering region, the light in the display region becomes more uniform. As such, the zigzag display phenomenon is suppressed, and the display of edge patterns becomes smoother. The disclosed irregularly-shaped display panel can be applied to liquid crystal display (LCDs) panels or organic light-emitting display (OLEDs) panels.

Figure 2:
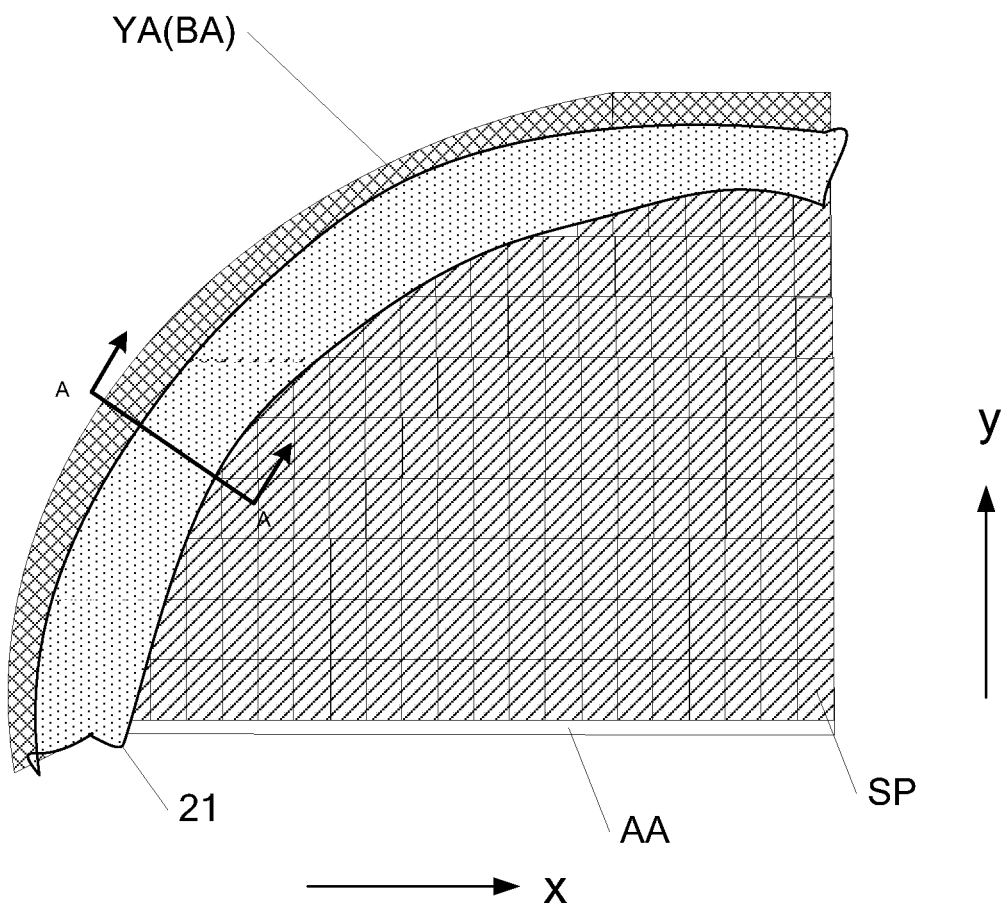
FIG. 2 illustrates a schematic top view of an exemplary display panel according to some embodiments of the present disclosure.
Figure 3:
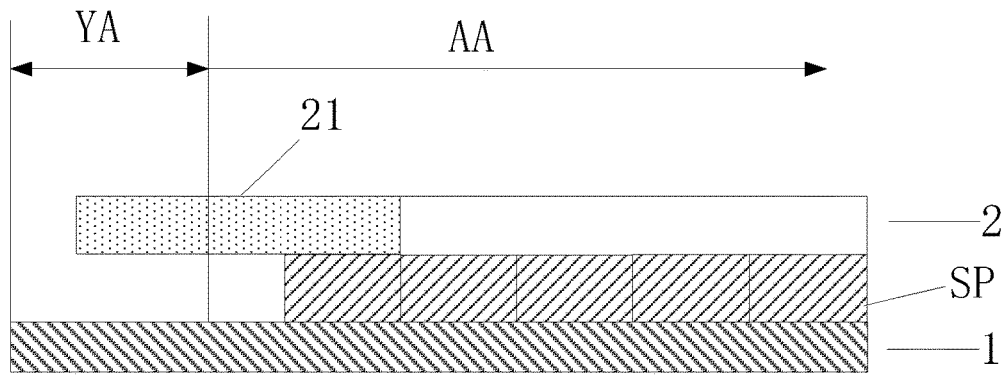
FIG. 3 illustrates a schematic cross-sectional view the display panel shown in FIG. 2 along an AA direction.

FIG. 2 illustrates a schematic top view of an exemplary display panel according to some embodiments of the present disclosure. FIG. 3 illustrates a schematic cross-sectional view the display panel shown in FIG. 2 along an AA direction. For illustrative purposes, the display panel shown in FIG. 2 only includes a portion of an irregularly-shaped border. Referring to FIGS. 2-3, in one embodiment, the display panel may include an array substrate 1. The array substrate 1 may include a display region AA and a border region BA surrounding the display region. A plurality of display pixels SP may be disposed in the display region AA. The plurality of display pixels may form a plurality of pixel rows extending along a first direction x, and a plurality of pixel columns extending along a second direction y. The border region BA may include an irregularly-shaped border YA. The plurality of display pixels SP may include a first plurality of display pixels SP adjacent to the irregularly-shaped border YA, and the first plurality of display pixels SP may be located in different pixel rows and also in different pixel columns. The first direction x and the second direction y may intersect each other. The display panel may also include a scattering layer 2 formed on one side of the array substrate 1. The scattering layer 2 may include a scattering region 21. The scattering region 21 may contain a plurality of scattering particles. The orthogonal projection of the scattering region 21 on the array substrate 1 may at least partially cover the first plurality of display pixels SP adjacent to the irregularly-shaped border YA.

It should be noted that in FIG. 3, a layer between the array substrate 1 and the scattering layer 2 may be a display material layer, and the display material layer may be made of a liquid crystal display material or an organic light-emitting material. In view of the irregular arrangement of the display pixels SP in the irregularly-shaped border YA easily causing the zigzag display problem, the present disclosure may dispose a scattering region 21 on one side of the array substrate. The orthogonal projection of the scattering region 21 on the array substrate 1 may completely or partially cover the first plurality of display pixels SP adjacent to the irregularly-shaped border YA.

Figure 4:
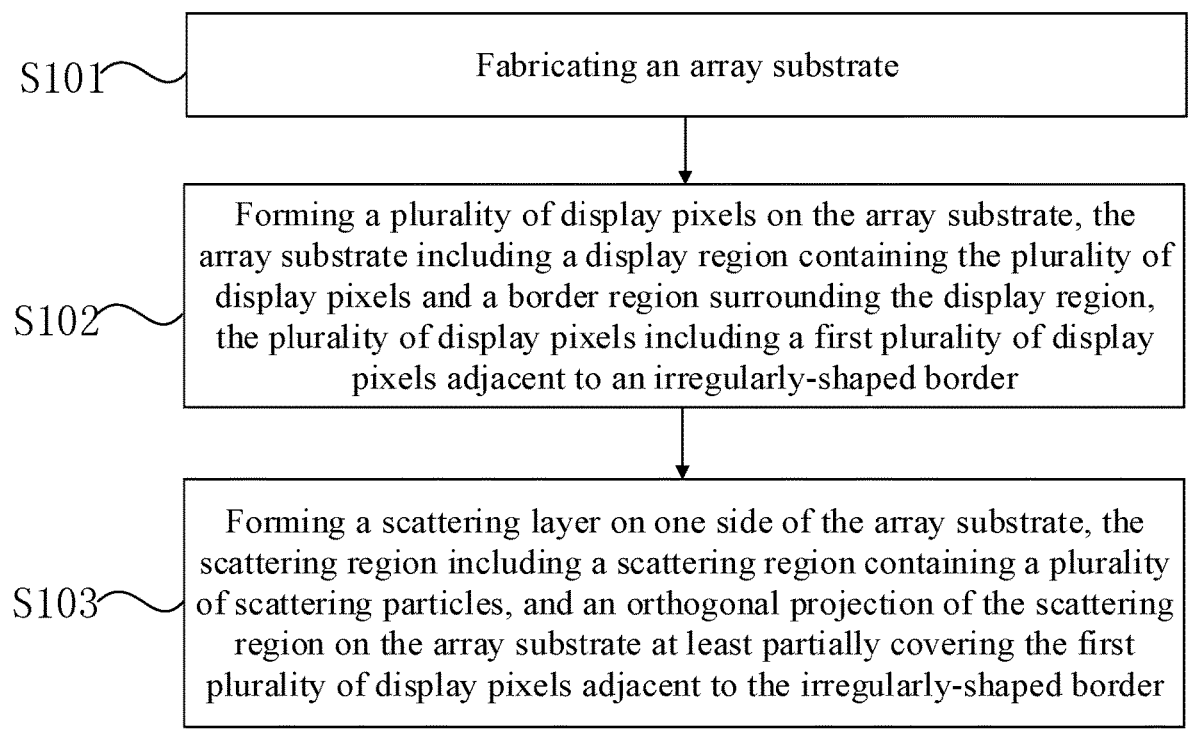
FIG. 4 illustrates a schematic flowchart of an exemplary method for fabricating a display panel according to some embodiments of the present disclosure.
Figure 5:
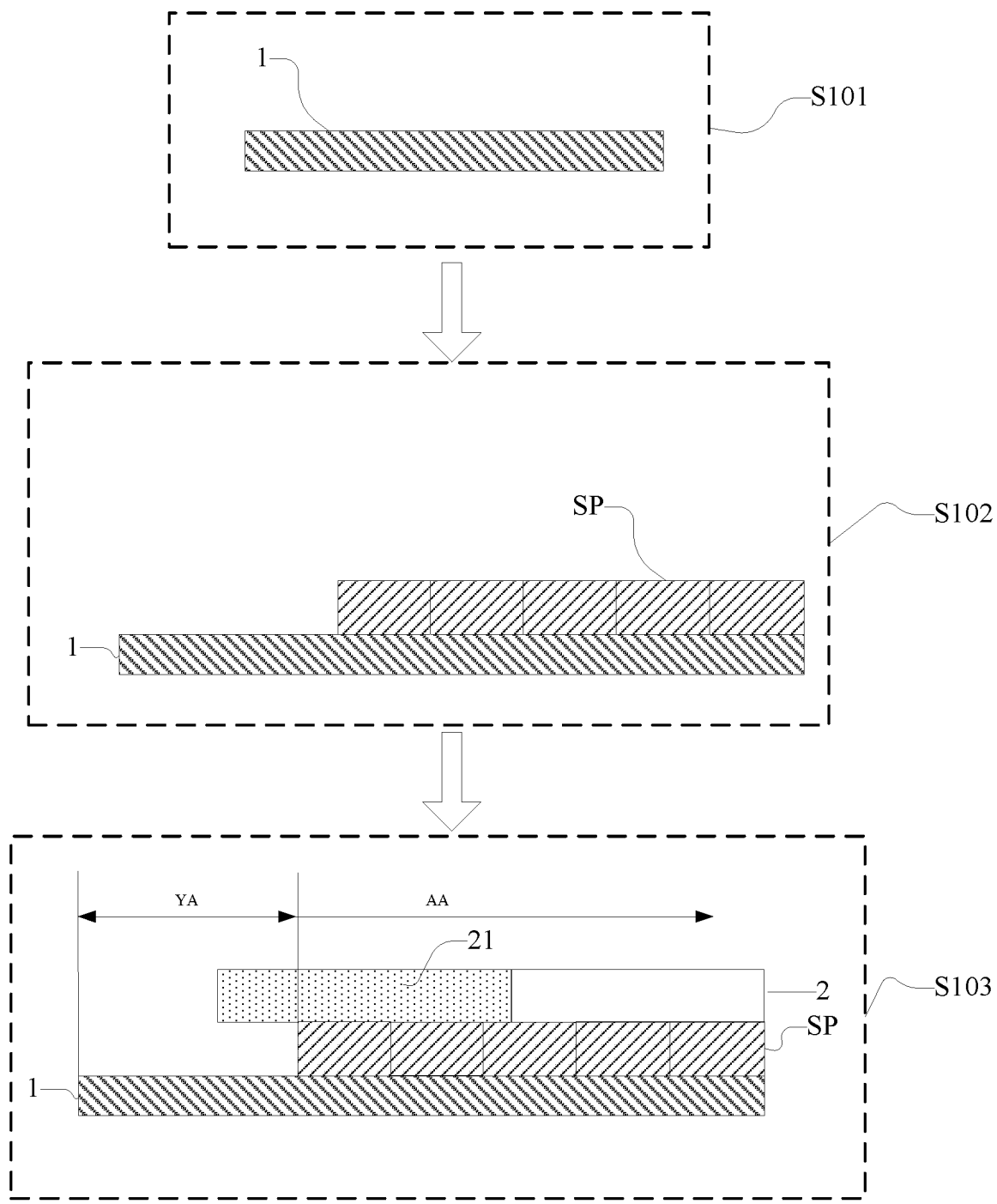
FIG. 5 illustrates schematic views of semiconductor structures at certain stages of an exemplary method for fabricating a display panel according to some embodiments of the present disclosure.

The disclosed display panel may be able to suppress the zigzag display problem. FIG. 4 illustrates a schematic flowchart of an exemplary method for fabricating a display panel according to some embodiments of the present disclosure, and FIG. 5 illustrates schematic views of semiconductor structures at certain stages of the exemplary method. Referring to FIG. 4-5, the disclosed method for fabricating the display panel may include the following exemplary steps.

In step S101, an array substrate 1 may be fabricated.

In step S102, a plurality of display pixels SP may be fabricated on the array substrate 1. A region containing the plurality of display pixels SP may be a display region AA, and a region surrounding the display region AA may be a border region BA. The plurality of display pixels SP may include a plurality of pixel rows extending along a first direction x and a plurality of pixel columns extending along a second direction y. The border region BA may include at least one irregularly-shaped border YA. The plurality of display pixels SP may include a first plurality of display pixels SP adjacent to the irregularly-shaped border YA, and the first plurality of display pixels SP may be located in different pixel rows and also in different pixel columns. The first direction x and the second direction y may intersect each other. The plurality of pixel rows and the plurality of pixel columns are schematically illustrated in FIG. 2.

In step S103, a scattering layer 2 may be formed on one side of the array substrate 1. The scattering layer 2 may include a scattering region 21, and the scattering region 21 may contain a plurality of scattering particles. The orthogonal projection of the scattering region 21 on the array substrate 1 may at least cover a portion of the first plurality of display pixels SP adjacent to the irregularly-shaped border YA. The scattering layer 2 and the scattering region 21 are schematically illustrated in FIG. 3.

Referring to FIG. 5, the orthogonal projection of the scattering region 21 on the array substrate 1 may at least cover a portion of the first plurality of display pixels SP adjacent to the irregularly-shaped border YA. In some embodiments, other film layers may be disposed between the display material layer and the scattering layer 2; alternatively, in other embodiments, the scattering layer 2 may be directed attached to cover the display material layer.

Therefore, according to the display panel and the fabrication method for the display panel, by disposing a scattering region on one side of the array substrate, the orthogonal projection of the scattering region on the array substrate can cover at least a portion of the display pixels adjacent to the irregularly-shaped border. As such, light emitted from the display region adjacent to the irregularly-shaped border may be scattered, such that the light in the display region may be more uniform. Therefore, the zigzag display phenomenon may be suppressed, and the display of edge patterns may become smoother.

In one embodiment, the orthogonal projection of the scattering region 21 on the array substrate 1 may completely cover the first plurality of display pixels SP adjacent to the irregularly-shaped border YA.

According to the disclosed display panel, the amount of the first plurality of display pixels SP that is adjacent to the irregularly-shaped border YA and covered by the scattering region 21 of the scattering layer 2 may determine the scattering effect on the display pixels SP adjacent to the irregularly-shaped border YA. When the orthogonal projection of the scattering region 21 on the array substrate 1 completely covers the first plurality of display pixels SP adjacent to the irregularly-shaped border YA, light emitted from all the first plurality of display pixels SP adjacent to the irregularly-shaped border YA may be scattered by the scattering region 21, such that the zigzag display phenomenon near the irregularly-shaped border YA may be suppressed, and the display of edge patterns may become smoother.

Figure 6:
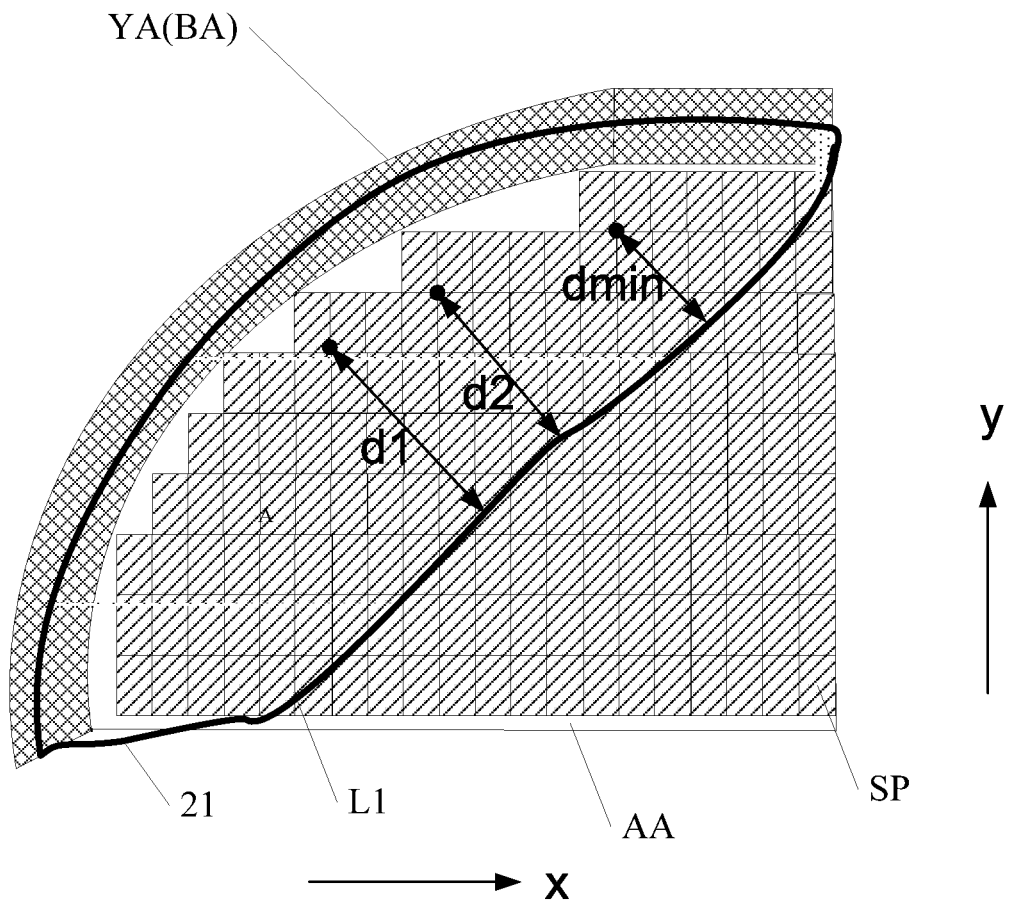
FIG. 6 illustrates a schematic top view of another exemplary display panel according to some embodiments of the present disclosure.

FIG. 6 illustrates a schematic top view of another exemplary display panel according to some embodiments of the present disclosure. Referring to FIG. 6, in one embodiment, the edge of the scattering region 21 may form a first curve L1 in the display region AA, and the shortest distance dmin from the first curve L1 to the first plurality of display pixels SP adjacent to the irregularly-shaped border YA may be larger than or equal to 0.1 mm.

In one embodiment, a distance from the first curve L1 to a display pixel SP that is adjacent to the irregularly-shaped border YA may be defined as the shortest distance from a corner of the display pixel SP that is furthest away from the irregularly-shaped border YA to the first curve L1. For example, referring to FIG. 6, a distance from a first display pixel SP to the first curve L1 is d1, a distance of a second display pixel SP to the first curve L1 is d2, and a distance of a third display pixel SP to the first curve L1 is dmin. In addition, among d1, d2, and dmin, the value of dmin is the smallest. Further, among all the distances from the first curve L1 to the first plurality of display pixels SP adjacent to the irregularly-shaped border YA, dmin may still be the shortest distance. In one embodiment, dmin may have a value larger than or equal to 0.1 mm.

In one embodiment, the scattering region may need to fully cover the first plurality of display pixels SP adjacent to the irregularly-shaped border YA. That is, the scattering region may full cover all the display pixels SP in a zigzag region formed by the irregularly-shaped border YA. However, due to the limitation of the current manufacturing technology, the orthogonal projection image of the scattering region 21 on the array substrate 1 need to have a width larger than or equal to the dimension of the zigzag pattern plus 0.1 mm. That is, the shortest distance from the first curve L1 to the first plurality of display pixels SP adjacent to the irregularly-shaped border YA may be larger than or equal to 0.1 mm.

Combined with the existing manufacturing technology and by setting the shortest distance between the edge of the scattering region in the display region to the irregularly-shaped border, the disclosed display panel may not only ensure that the width of the scattering region is larger than the zigzag region, but also defines the minimum value of the distribution range of the scattering particles in the scattering layer. As such, the disclosed display panel may be conducive to the quantification for display panel manufacture.

The scattering particles may include one of more of inorganic particles, organic particles, and composite particles. It should be noted that in order to achieve a desired scattering effect in the scattering region, any types of particles capable for scattering, including inorganic particles, organic particles, and composite particles, may be adopted. Further, inorganic particles that are capable for scattering may include metal particles.

In one embodiment, the scattering particles adopted in the disclosed display panel may include one or more of inorganic particles, organic particles, and composite particles. Because of the variety of choices, it may be possible to, through comparison, select out scattering particles that have desired effect for the scattering in the scattering region.

In one embodiment, the particle size of scattering particles may be larger than or equal to 20 nm, but smaller than or equal to 100 nm.

It should be noted that the type and the rule of the scattering particles may be determined by the existing fabrication process for scattering layers and the characteristics of the scattering particles. For example, when the particle size of the scattering particles is less than approximately 20 nm, the scattering effect of the scattering particles may be undesired, and may even be substantially absent. When the particle size of scattering particles is larger than 100 nm, the scattering particles may be less soluble in the organic solution, and thus cannot be uniformly distributed. When the inkjet printing technology is adopted, the printing device may be blocked by scattering particles with a particle size larger than approximately 100 nm.

In the disclosed display panel, the particle size of the scattering particles is selected to be larger than or equal to 20 nm but smaller than or equal to 100 nm, and thus the effectiveness of the scattering particles in the scattering region may be ensured.

Figure 7:
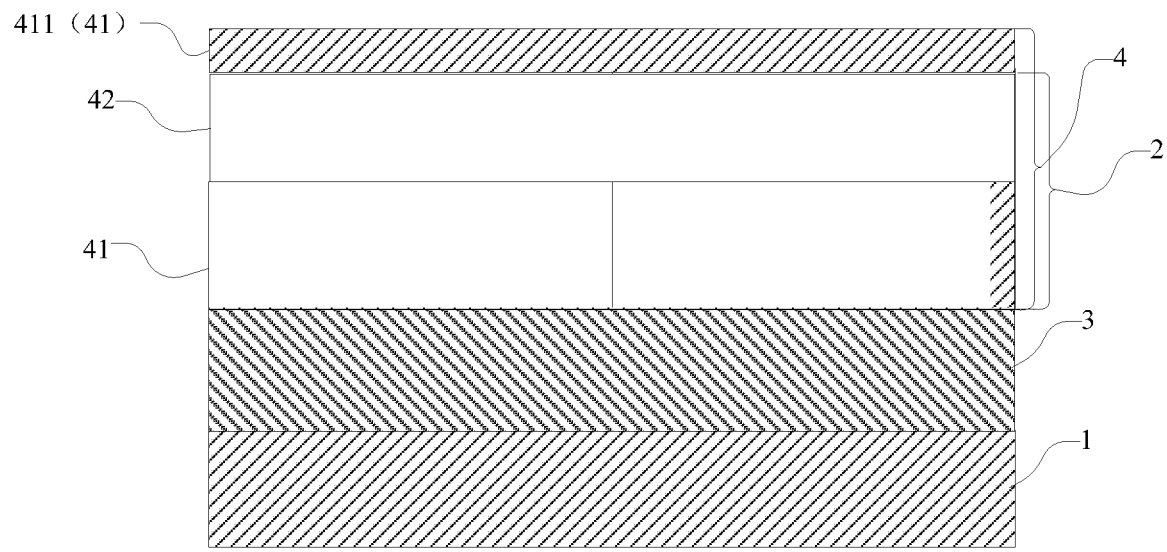
FIG. 7 illustrates a schematic block diagram of an exemplary display panel according to some embodiments of the present disclosure.

FIG. 7 illustrates a schematic block diagram of an exemplary display panel according to some embodiments of the present disclosure. Referring to FIG. 7, in one embodiment, the display panel may include an organic light-emitting material layer 3 formed on one side of the array substrate 1 and a thin-film packaging layer 4 formed on the side of the light-emitting material layer 3 that is far away from the array substrate 1. The thin-film packaging layer 4 may include a stacked packaging structure containing a plurality of inorganic layers 41 and a plurality organic layers 42. The plurality of inorganic layer 41 may include a first inorganic layer 411 that is furthest away from the array substrate 1 among the plurality of inorganic layers 41 and the plurality organic layers 42. The scattering layer may be located between the organic light-emitting material layer 3 and the first inorganic layer 411.

It should be noted that the thin-film packaging layer 4 may include at least one organic layer 42 and at least one inorganic layer 41. The thin-film packaging layer 4 may be used to prevent the display elements of the display device layer from being affected by the external environment (such as moisture, air, etc.). The inorganic layer 41 of the thin-film packaging layer 4 may mainly serve to prevent erosion caused by water and oxygen, and the organic layer 42 may be used to cover particles and substrate steps formed when forming the inorganic layer 41, to release stress between adjacent inorganic layers 41, etc. As shown in FIG. 7, the plurality of inorganic layers 41 and the plurality of organic layers 42 are alternately disposed in the thin-film packing layer 4. In other embodiment, the plurality of inorganic layers 41 and the plurality of organic layers 42 in the thin-film packing layer 4 may be stacked together in any other appropriate manner. The scattering layer 2 shown in FIG. 7 includes one organic layer 42 and two inorganic layers 41, and the scattering layer 2 is located between the first inorganic layer 411 and the organic light-emitting material layer 3.

Figure 8:
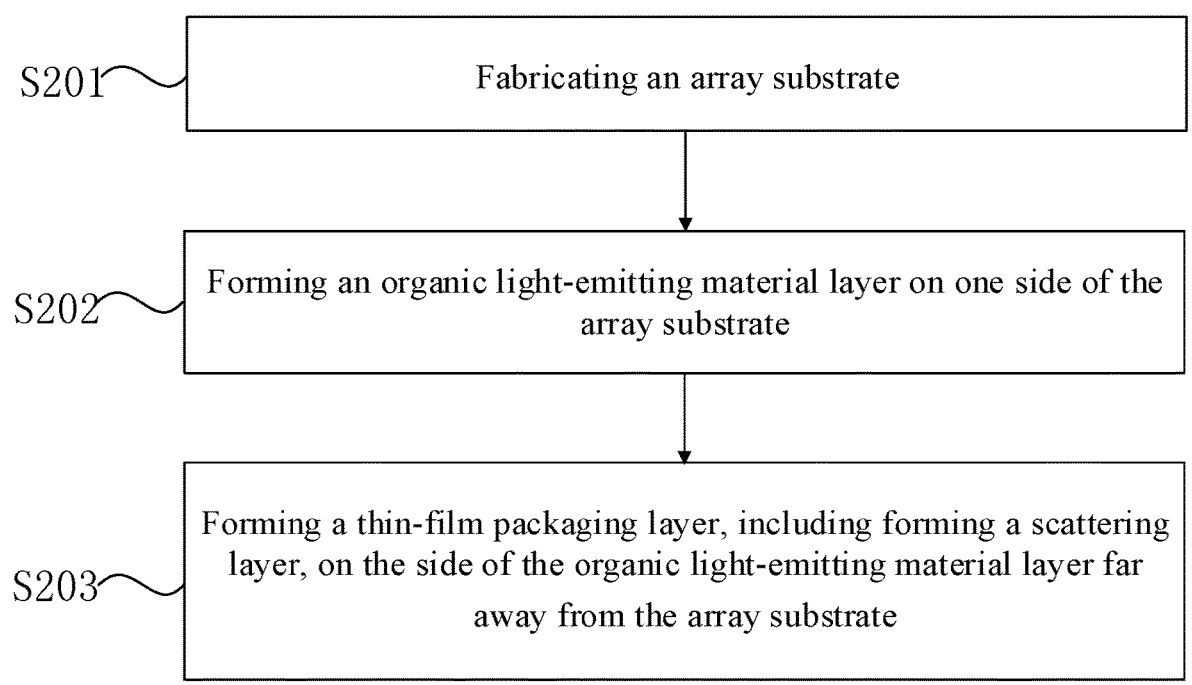
FIG. 8 illustrates a schematic flowchart of another exemplary method for fabricating a display panel according to some embodiments of the present disclosure.
Figure 9:
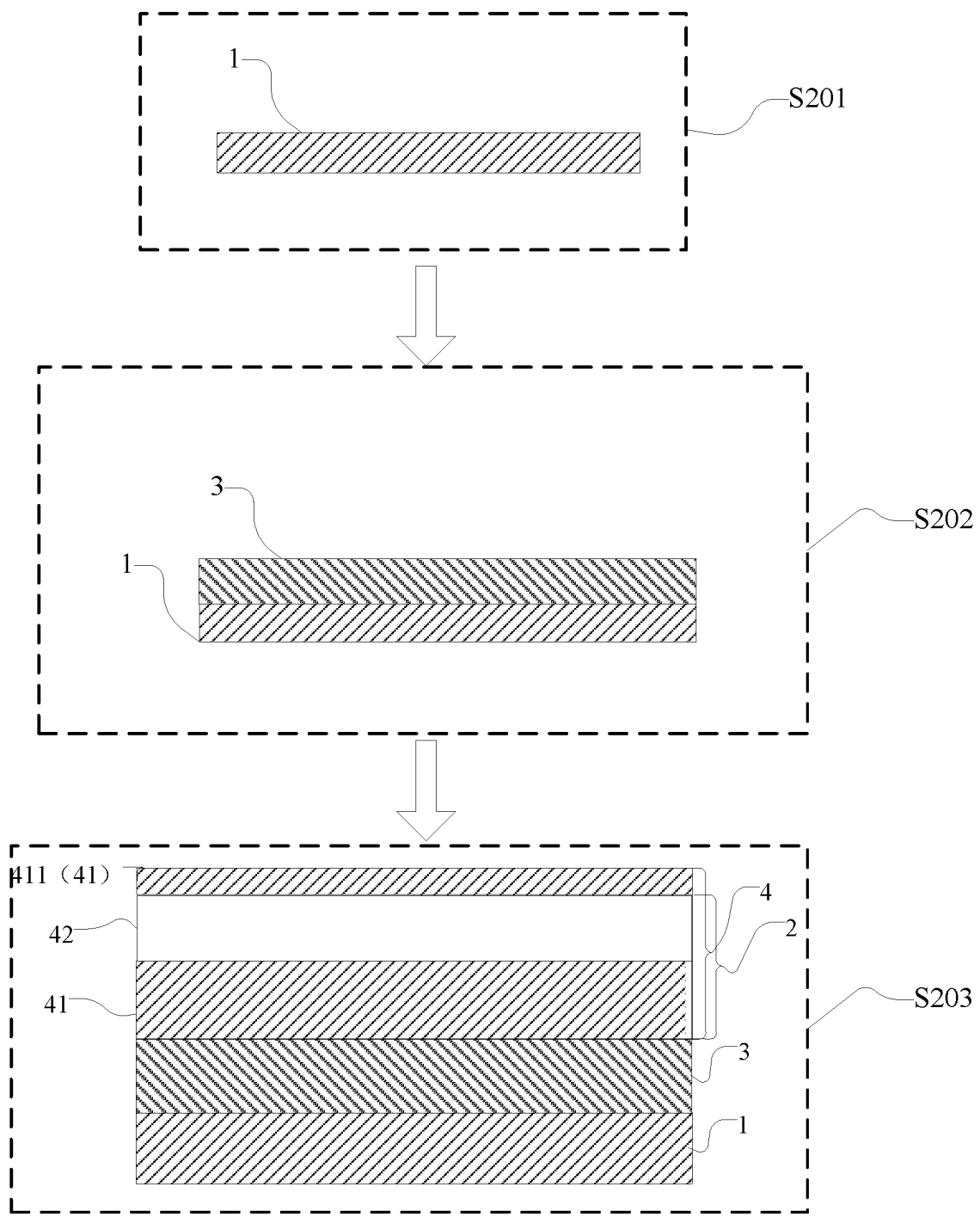
FIG. 9 illustrates schematic views of semiconductor structures at certain stages of another exemplary method for fabricating a display panel according to some embodiments of the present disclosure.

FIG. 8 illustrates a schematic flowchart of another exemplary method for fabricating a display panel according to some embodiments of the present disclosure, and FIG. 9 illustrates schematic views of semiconductor structures at certain stages of the exemplary method. Referring to FIGS. 8-9, the disclosed method for fabricating the display panel may include the following exemplary steps.

In step S201, an array substrate 1 may be fabricated.

In step S202, an organic light-emitting material layer 3 may be formed on one side of the array substrate 1. The fabrication of the organic light-emitting material layer 3 may be a step during the fabrication of a plurality of display pixels SP. For example, a pixel definition layer may be disposed on the array substrate 1, and an organic light-emitting material may be evaporated onto a plurality of opening regions of the pixel definition layer. Each opening region of the pixel definition layer may correspond to a display pixel SP. As such a plurality of display pixels SP may be formed on the array substrate 1.

In step S203, a thin-film packaging layer 4 may be formed on the side of the organic light-emitting material layer 3 that is far away from the array substrate 1. The fabrication of the thin-film packaging layer 4 may be a step during the fabrication of a scattering layer 2. The thin-film packaging layer 4 may include a stacked packaging structure containing a plurality of inorganic layers 41 and a plurality organic layers 42. The plurality of inorganic layer 41 may include a first inorganic layer 411 that is furthest away from the array substrate 1 among the plurality of inorganic layers 41 and the plurality organic layers 42. The scattering layer may be located between the organic light-emitting material layer 3 and the first inorganic layer 411.

Therefore, according to the display panel and the fabrication method for the display panel, the scattering layer is disposed between the organic light-emitting material layer and the first inorganic layer. Therefore, without changing the existing manufacturing process for display panels, the scattering layer can be obtained by alternating the material only, such that though the scattering layer, the purpose of reducing the zigzag pattern appearing in the display panel may be achieved. As such, the fabrication process may be simple and easy for implementation.

Referring to FIG. 7, in one embodiment, the scattering layer 2 may be formed by doping the scattering particles into the organic material of at least one organic layer 42.

It should be noted that doping the scattering particles into the organic material may be achieved using an inkjet printing method. For example, a general inkjet printing material may be used to print the portion of the organic layer 42 in the thin-film packaging layer 4 that corresponds to the regular display region, and an inkjet printing material mixed with the scattering particles may be sued to print the portion of the organic layer 42 that corresponds to the irregular display region (i.e., the portion of the display region adjacent to the irregularly-shaped border). According to the disclosed display panel and fabrication method, the fabrication process may be simple, and the inkjet printing region may be controllable.

For example, the disclosed display panel may be fabricated by a method including the following exemplary steps.

In step S301, an array substrate 1 may be fabricated.

In step S302, an organic light-emitting material layer 3 may be formed on one side of the array substrate 1. The fabrication of the organic light-emitting material layer 3 may be a step during the fabrication of a plurality of display pixels SP. The process for fabricating an organic light-emitting material layer has been described above, and will not be repeated here.

In step S303, a stacked packaging structure including a plurality of inorganic layers 41 and a plurality of organic layer 42 may be formed on the side of the organic light-emitting material layer 3 that is far away from the array substrate 1. The plurality of inorganic layer 41 may include a first inorganic layer 411 that is furthest away from the array substrate 1 among the plurality of inorganic layers 41 and the plurality organic layers 42.

During the implementation of step S303, a scattering layer 2 may be formed by doping the organic material of at least one organic layer 42, among the plurality of organic layers 42, with the scattering particles. The scattering layer 2 may thus be located between the organic light-emitting material layer 3 and the first inorganic layer 411.

According to the display panel and the fabrication method, the scattering layer is disposed in at least one organic layer. Therefore, the process may be simple and easy for implementation, and the formation of the scattering region may be controllable. In addition, zigzag patterns appearing in the display panel may be effectively reduced.

Figure 10:
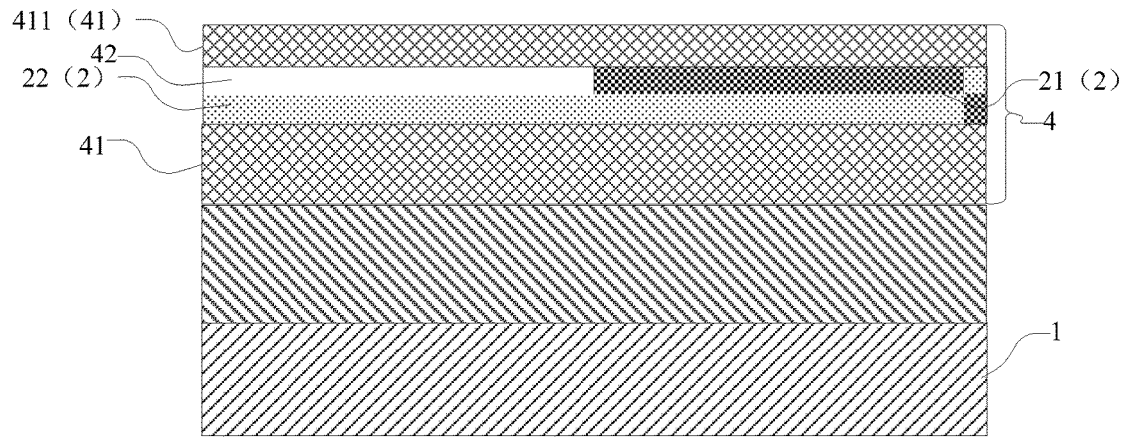
FIG. 10 illustrates a schematic block diagram of another exemplary display panel according to some embodiments of the present disclosure.

FIG. 10 illustrates a schematic block diagram of another exemplary display panel according to some embodiments of the present disclosure. Referring to FIG. 10, in one embodiment, the scattering layer 2 may further include a non-scattering region 22. The non-scattering region 22 may be made of a first organic material. The scattering region 21 may be made of the first organic material doped with the scattering particles. That is, the scattering region 21 may be made of a scattering-particle-doped first organic material.

It should be noted that according to the disclosed display panel, the first organic material may be a regular material for forming an organic layer, and by merely doping the scattering particles into the first organic material, the formed scattering layer may be capable for scattering.

Figure 11:
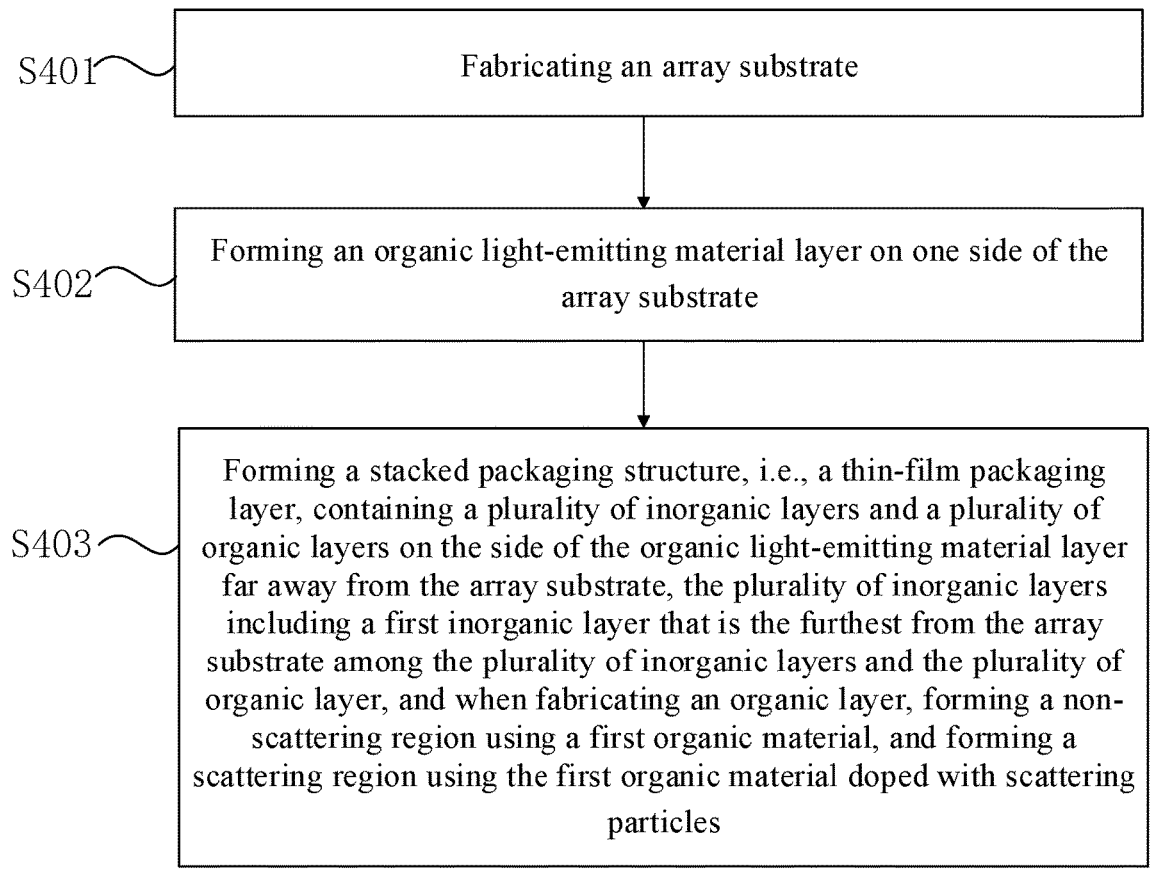
FIG. 11 illustrates a schematic flowchart of another exemplary method for fabricating a display panel according to some embodiments of the present disclosure.
Figure 12:
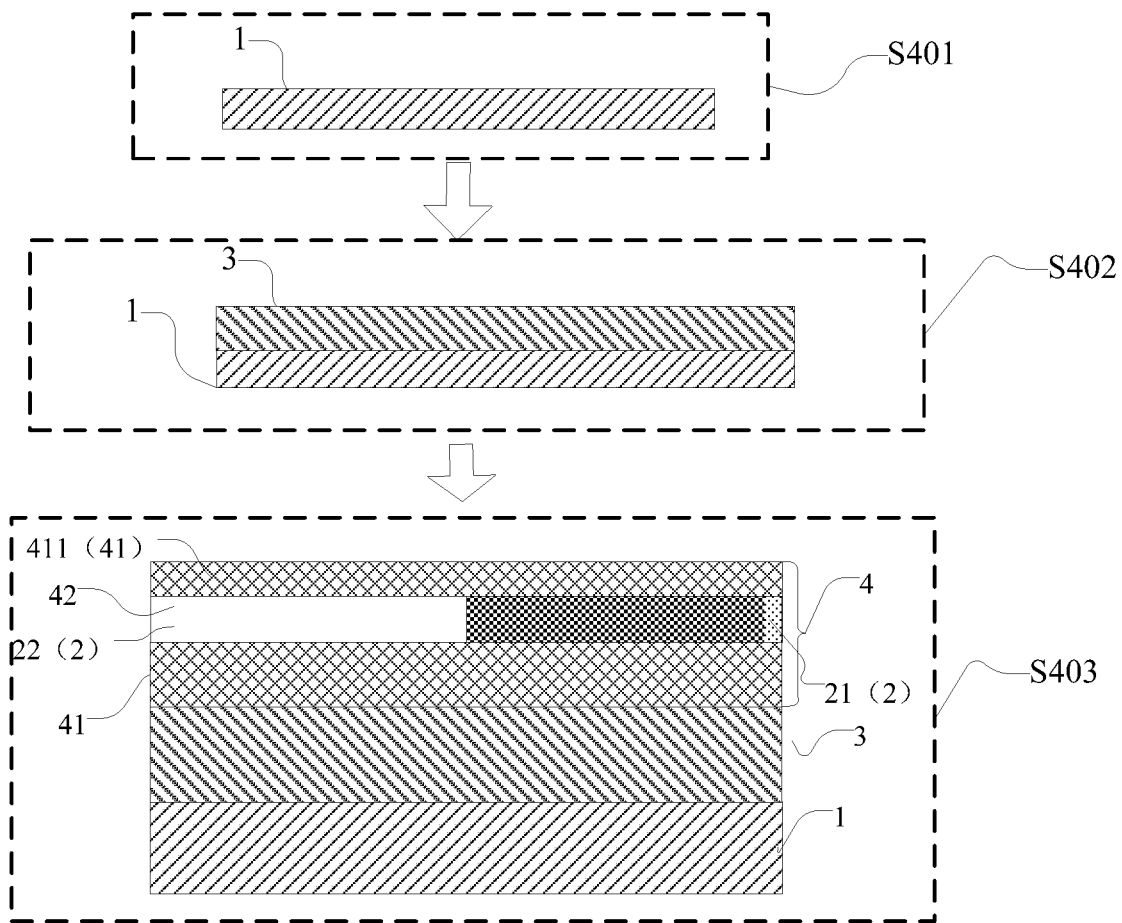
FIG. 12 illustrates schematic views of semiconductor structures at certain stages of another exemplary method for fabricating a display panel according to some embodiments of the present disclosure.

FIG. 11 illustrates a schematic flowchart of another exemplary method for fabricating a display panel according to some embodiments of the present disclosure, and FIG. 12 illustrates schematic views of semiconductor structures at certain stages of the exemplary method. Referring to FIGS. 11-12, the disclosed method for fabricating the display panel may include the following exemplary steps.

In step S401, an array substrate 1 may be fabricated.

In step S402, an organic light-emitting material layer 3 may be formed on one side of the array substrate 1. The fabrication of the organic light-emitting material layer 3 may be a step during the fabrication of a plurality of display pixels SP. The process for fabricating an organic light-emitting material layer has been described above, and will not be repeated here.

In step S403, a stacked packaging structure, i.e. a thin-film packaging layer, including a plurality of inorganic layers 41 and a plurality of organic layer 42 may be formed on the side of the organic light-emitting material layer 3 that is far away from the array substrate 1. The plurality of inorganic layer 41 may include a first inorganic layer 411 that is furthest away from the array substrate 1 among the plurality of inorganic layers 41 and the plurality organic layers 42.

In one embodiment, when fabricating one organic layer 42 among the plurality of organic layer 42, a non-scattering region 22 may be formed by using a first organic material, and then a scattering region 21 may be formed by using the first organic material doped with the scattering particles (i.e., a scattering-particle-doped first organic material). As such, a scattering layer 2 including the scattering region 21 and the non-scattering region 22 may be formed.

Therefore, according to the disclosed display panel and fabrication method, the scattering layer is formed to include a non-scattering region formed by a first organic material and a scattering region formed by a scattering-particle-doped first organic material. As such, compared with the fabrication of the non-scattering region, the fabrication of the scattering region may only require further doping the scattering particles. Therefore, the process may be simple and easy for implementation.

Figure 13:
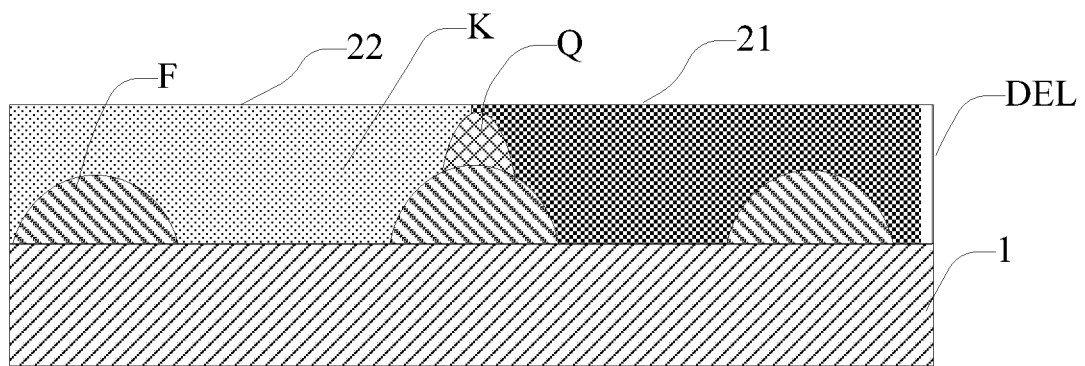
FIG. 13 illustrates a schematic block diagram of another exemplary display panel according to some embodiments of the present disclosure.

FIG. 13 illustrates a schematic block diagram of another exemplary display panel according to some embodiments of the present disclosure. Referring to FIG. 13, in one embodiment, the display panel may further include a pixel definition layer DEL formed on one side of the array substrate 1. The pixel definition layer DEL may include a plurality of opening regions K and a non-opening region F. The organic light-emitting material of the organic light-emitting material layer may be located in the plurality of opening regions K. A retaining wall Q may be formed in the non-opening region F on the side of pixel definition layer DEL that is far away from the array substrate 1, and the retaining wall Q may be located between the non-scattering region 22 and the scattering region 21 (i.e., the retaining wall Q may be formed at the boundary between the non-scattering region 22 and the scattering region 21).

It should be noted that the disclosed display panel and fabrication method can be applied to organic light-emitting diode (OLED) display panels.

Figure 14:
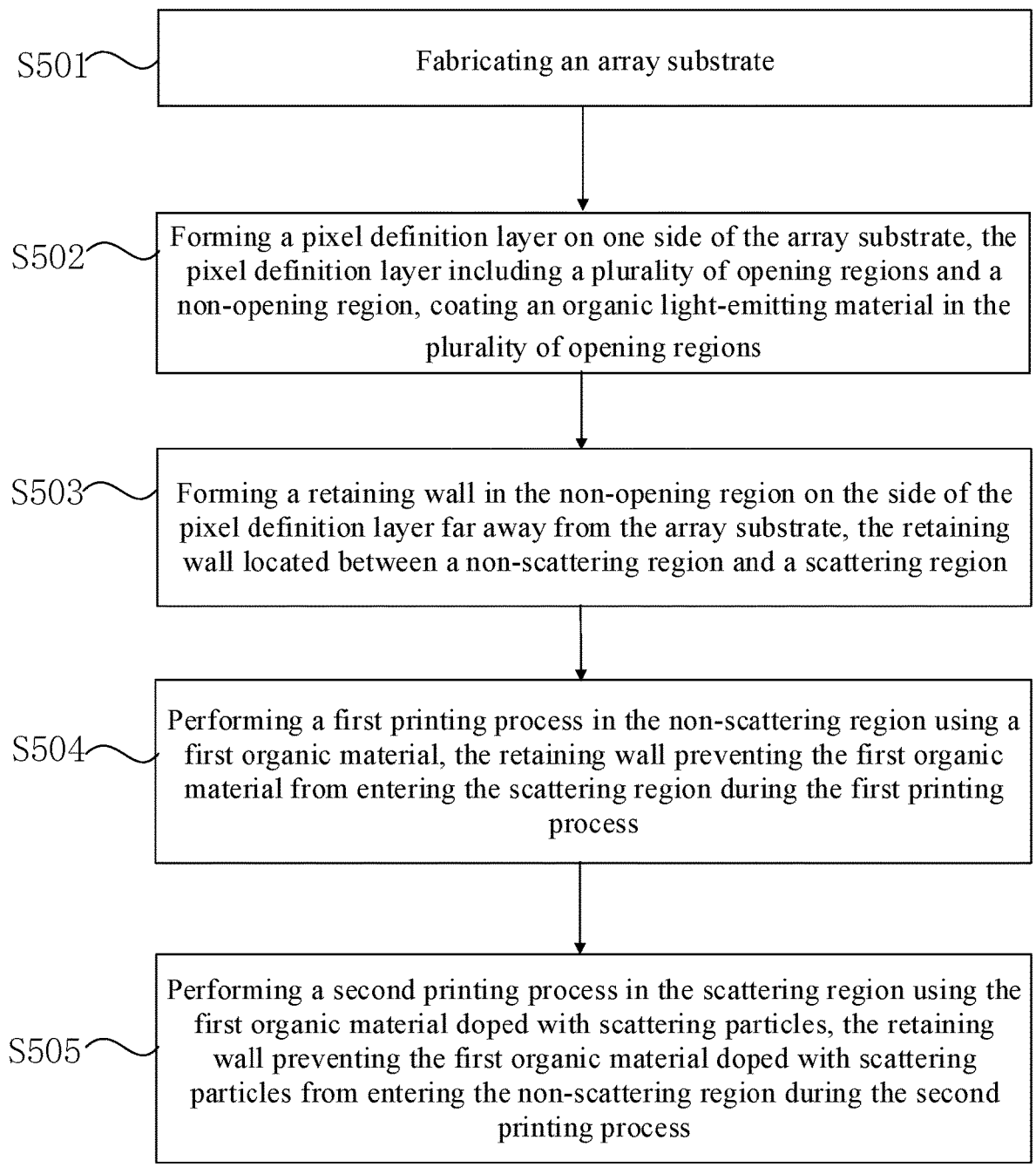
FIG. 14 illustrates a schematic flowchart of another exemplary method for fabricating a display panel according to some embodiments of the present disclosure.
Figure 15:
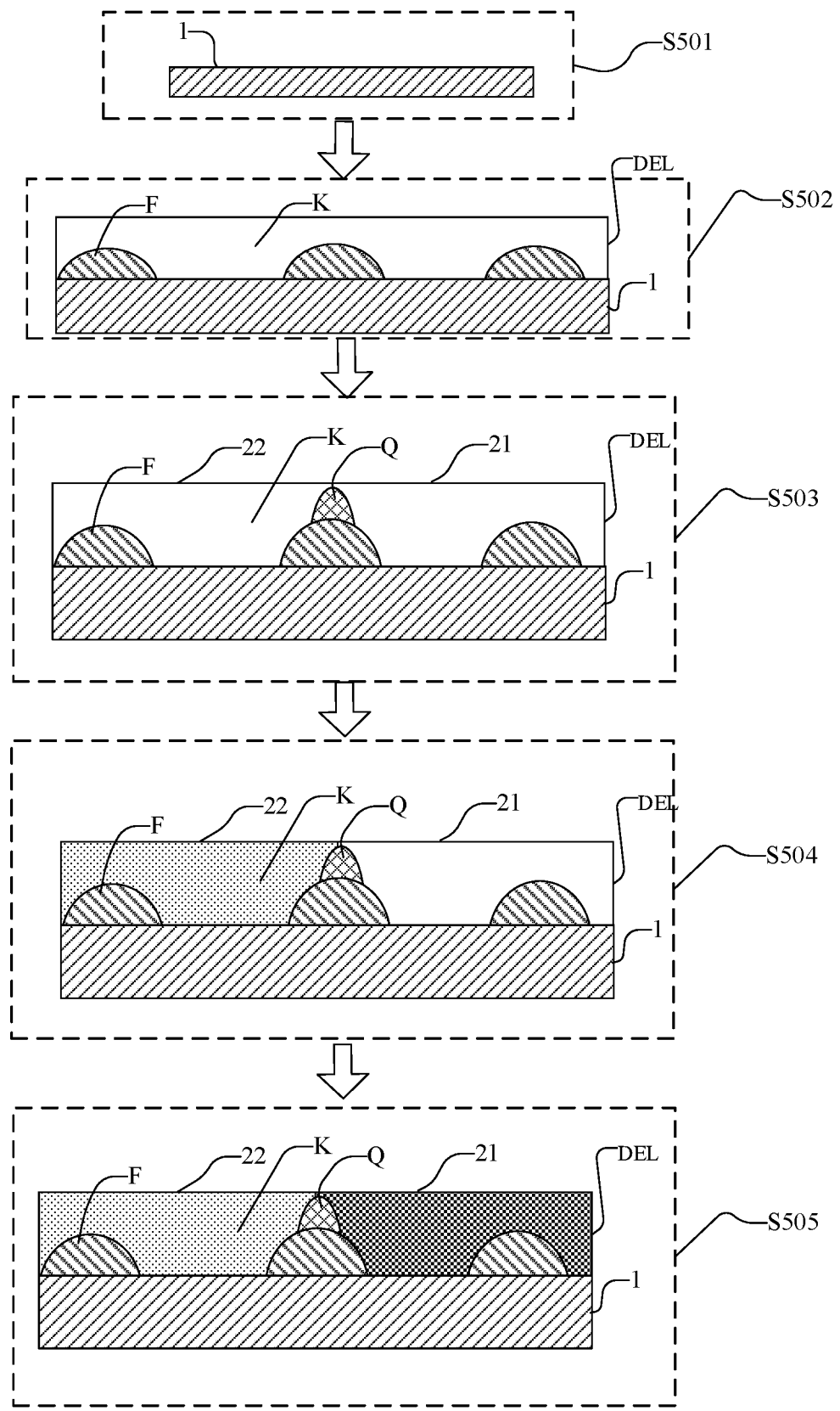
FIG. 15 illustrates schematic views of semiconductor structures at certain stages of another exemplary method for fabricating a display panel according to some embodiments of the present disclosure.

FIG. 14 illustrates a schematic flowchart of another exemplary method for fabricating a display panel according to some embodiments of the present disclosure, and FIG. 15 illustrates schematic views of semiconductor structures at certain stages of the exemplary method. Referring to FIGS. 14-15, the disclosed method for fabricating the display panel may include the following exemplary steps.

In step S501, an array substrate 1 may be fabricated.

In step S502, a pixel definition layer DEL may be formed on one side of the array substrate 1. The pixel definition layer DEL may include a plurality of opening regions K and a non-opening region F. An organic light-emitting material may be formed in the plurality of opening regions K.

In step S503, a retaining wall Q may be formed in the non-opening region F on the side of the pixel definition layer DEL that is far away from the array substrate 1. The retaining wall Q may be located between the non-scattering region 22 and the scattering region 21.

In step S504, a first printing process may be performed in the non-scattering region 22 using a first organic material. The retaining wall Q may be used to prevent the first organic material from entering the scattering region 21 during the first printing process.

In step S505, a second printing process may be performed in the scattering region 21 using the first organic material doped with scattering particles. That is, the second printing process performed in the scattering region may use a scattering-particle-doped material. The retaining wall Q may be used to prevent the scattering particles in the first organic material from entering the non-scattering region 22 during the second printing process.

Therefore, according to the disclosed display panel and fabrication method, after the fabrication of the pixel definition layer, a retaining wall is formed in the non-opening region on the side of the pixel definition layer that is far away from the array substrate. The retaining wall is used to prevent the first organic material formed in the non-scattering region from entering the scattering region, and also prevent the scatting-particle-doped first organic material formed in the scattering region from entering the non-scattering region. As such, the boundary between the non-scattering region and the scattering region can be effectively defined by the retaining wall, which may ensure the scattering effect in the scattering region, and thus the suppression of the zigzag display phenomenon may be more evident.

Figure 16:
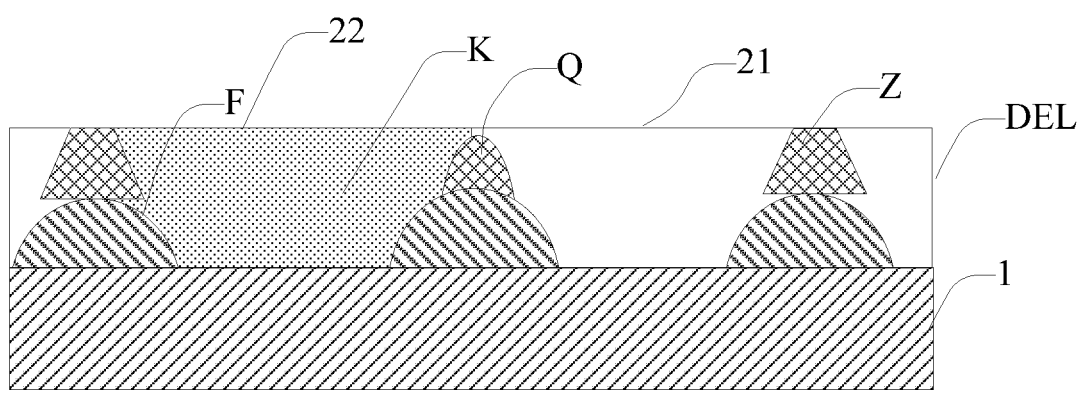
FIG. 16 illustrates a schematic block diagram of another exemplary display panel according to some embodiments of the present disclosure.

FIG. 16 illustrates a schematic block diagram of another exemplary display panel according to some embodiments of the present disclosure. Referring to FIG. 16, in one embodiment, due to the characteristics of organic materials, in order to provide desired support for the mask (in an organic light-emitting display panel) or the glass plate (in a liquid crystal display panel), the display panel may further include a plurality of support pillars Z formed in the non-opening region F on the pixel definition layer DEL that is far away from the array substrate 1. The plurality of support pillars Z may be made of a same material as the retaining wall Q, such that the plurality of support pillars Z and the retaining wall Q can be fabricated through a same process, which may reduce the process complexity.

It should be noted that the retaining wall of the disclosed display panel can be used to effectively define the boundary between the non-scattering region and the scattering region, and thus may ensure the scattering effect in the scattering region. The plurality of support pillars Z may be used to support for the evaporation mask plate during the evaporation process.

Figure 17:
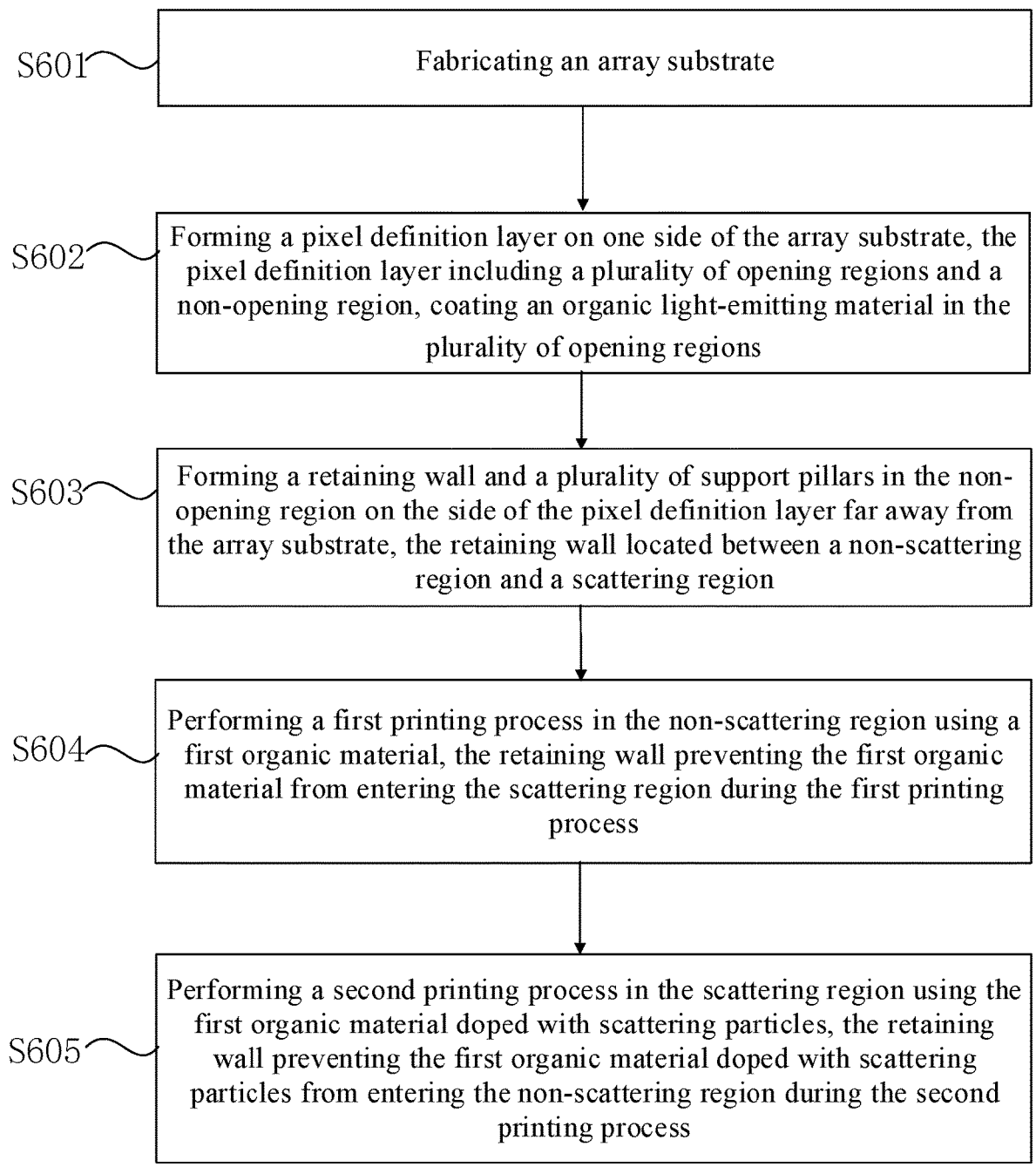
FIG. 17 illustrates a schematic flowchart of another exemplary method for fabricating a display panel according to some embodiments of the present disclosure.
Figure 18:
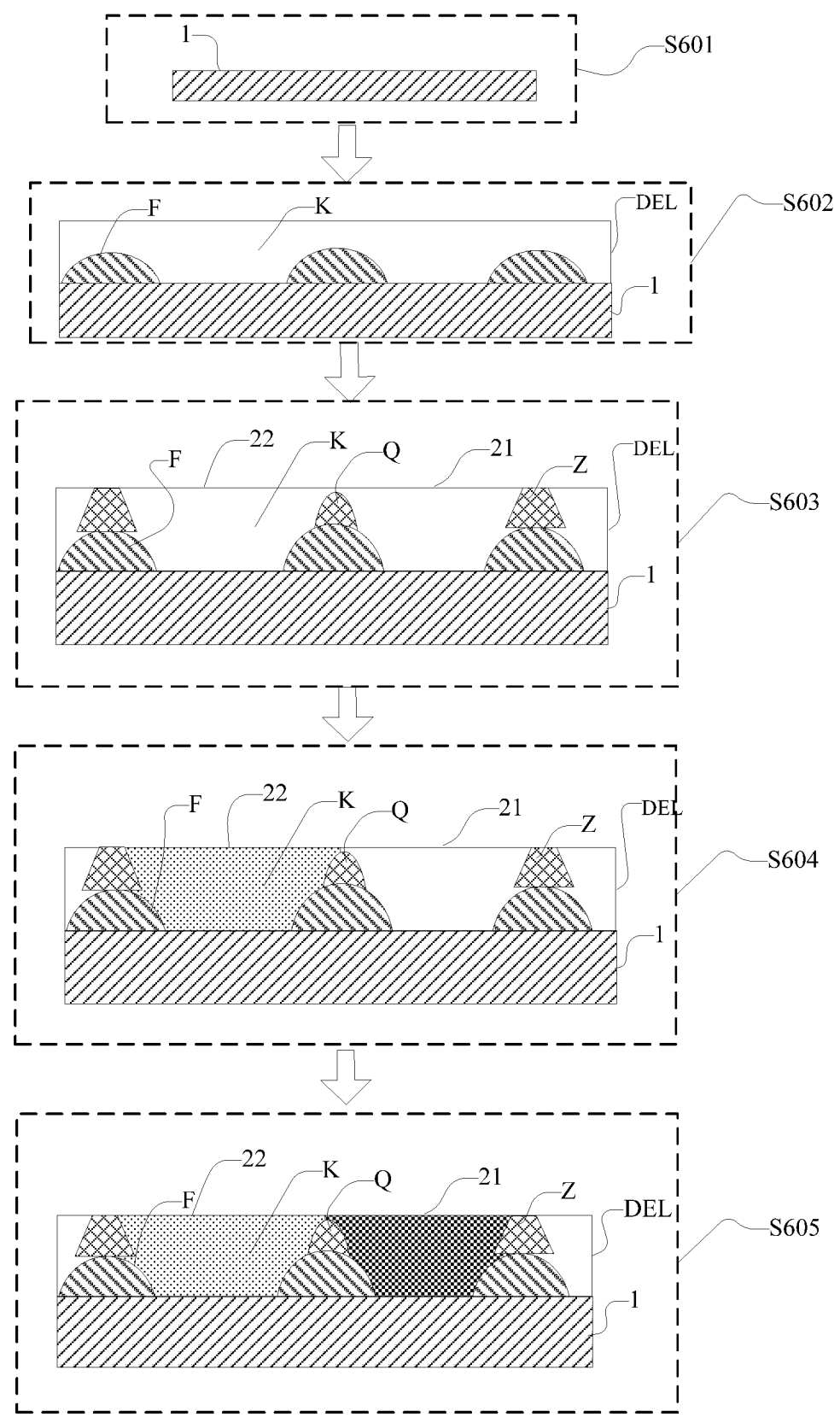
FIG. 18 illustrates schematic views of semiconductor structures at certain stages of another exemplary method for fabricating a display panel according to some embodiments of the present disclosure.

FIG. 17 illustrates a schematic flowchart of another exemplary method for fabricating a display panel according to some embodiments of the present disclosure, and FIG. 18 illustrates schematic views of semiconductor structures at certain stages of the exemplary method. Referring to FIGS. 17-18, the disclosed method for fabricating the display panel may include the following exemplary steps.

In step S601, an array substrate 1 may be fabricated.

In step S602, a pixel definition layer DEL may be formed on one side of the array substrate 1. The pixel definition layer DEL may include a plurality of opening regions K and a non-opening region F. An organic light-emitting material may be formed in the plurality of opening regions K.

In step S603, a retaining wall Q and a plurality of support pillar Z may be formed in the non-opening region F on the side of the pixel definition layer DEL that is far away from the array substrate 1. The retaining wall Q may be located between the non-scattering region 22 and the scattering region 21.

In step S604, a first printing process may be performed in the non-scattering region 22 using a first organic material. The retaining wall Q may be used to prevent the first organic material from entering the scattering region 21 during the first printing process.

In step S605, a second printing process may be performed in the scattering region 21 using the first organic material doped with scattering particles. That is, the second printing process performed in the scattering region may use a scattering-particle-doped material. The retaining wall Q may be used to prevent the scattering particles in the first organic material from entering the non-scattering region 22 during the second printing process.

Therefore, according to the disclosed display panel and fabrication method, the retaining wall and the plurality of support pillars are made of a same material. Therefore, the plurality of support pillars can be simultaneously fabricated with the retaining wall. As such, the fabrication process may be simplified, and the implementation of the fabrication method may be more convenient.

Figure 19:
FIG. 19 illustrates a schematic block diagram of another exemplary display panel according to some embodiments of the present disclosure.

The disclosed display panel and fabrication method can be applied to organic light-emitting display panels. The disclose display panel and fabrication method may also be applicable to organic light-emitting display panels having conventional package structures. FIG. 19 illustrates a schematic block diagram of another exemplary display panel according to some embodiments of the present disclosure. Referring to FIG. 19, in one embodiment, the disclosed display panel may include an organic light-emitting material layer 3 formed on one side of the array substrate 1, and a packaging cover 5 disposed on the side of the organic light-emitting material layer 3 that is far away from the array substrate. The scattering layer 2 may be located between the organic light-emitting material layer 3 and the packaging cover 5.

Figure 20:
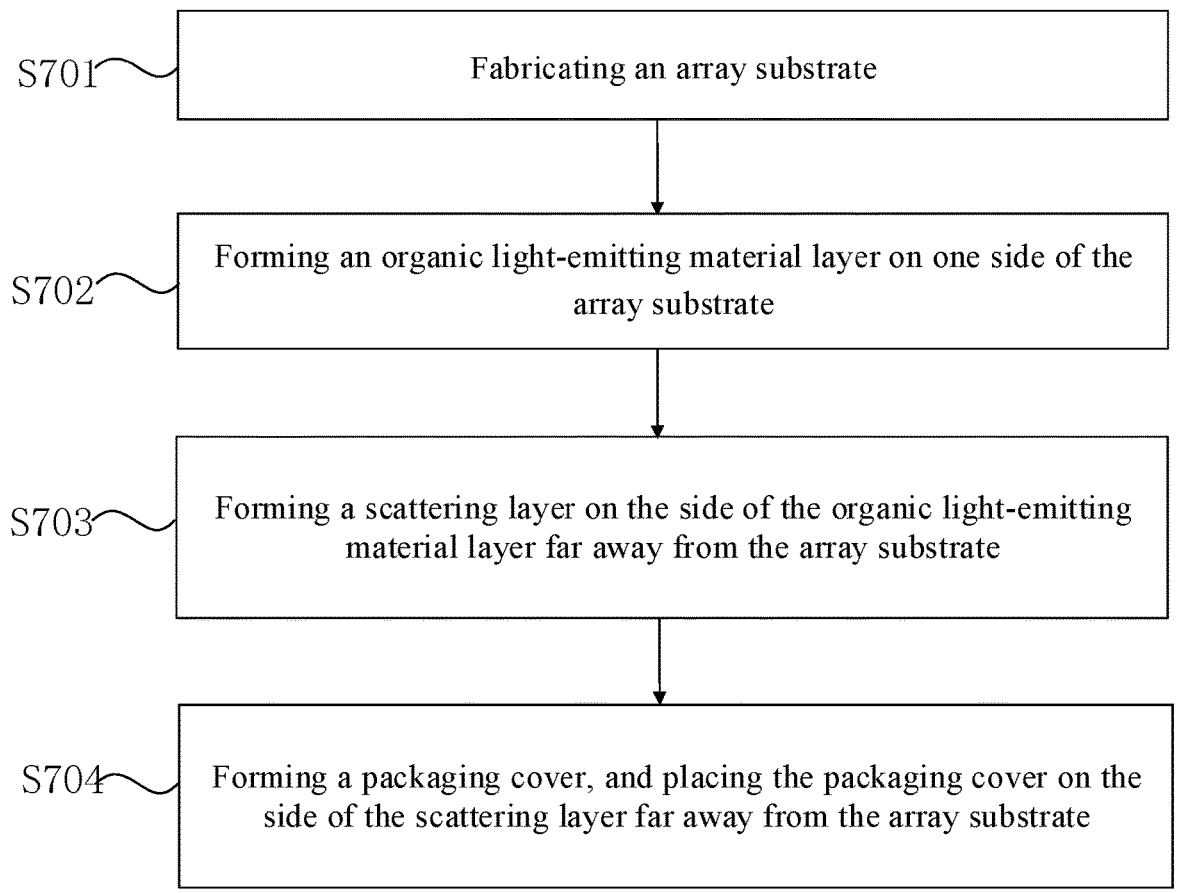
FIG. 20 illustrates a schematic flowchart of another exemplary method for fabricating a display panel according to some embodiments of the present disclosure.
Figure 21:
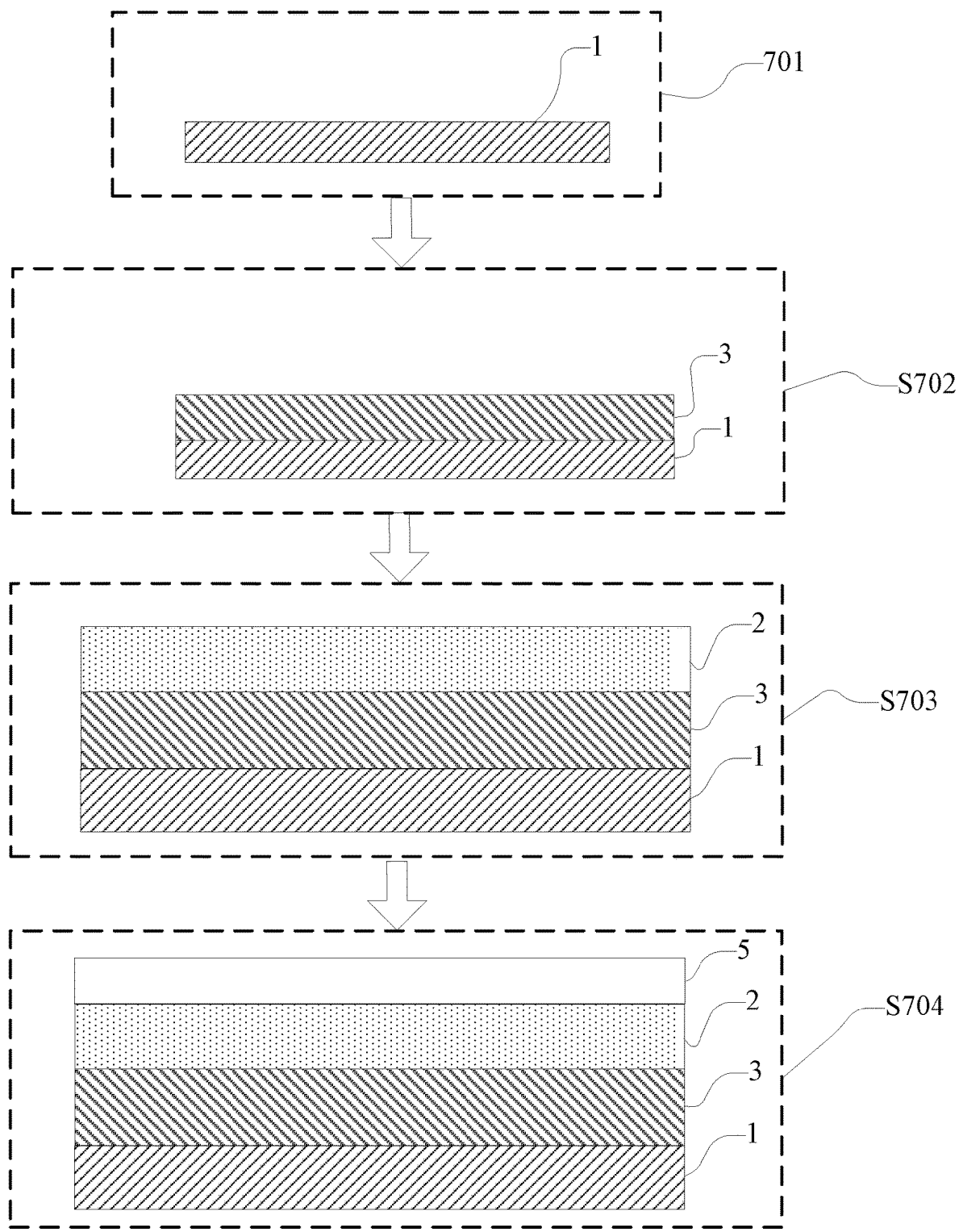
FIG. 21 illustrates schematic views of semiconductor structures at certain stages of another exemplary method for fabricating a display panel according to some embodiments of the present disclosure.

FIG. 20 illustrates a schematic flowchart of another exemplary method for fabricating a display panel according to some embodiments of the present disclosure, and FIG. 21 illustrates schematic views of semiconductor structures at certain stages of the exemplary method. Referring to FIGS. 20-21, the disclosed method for fabricating the display panel may include the following exemplary steps.

In step S701, an array substrate 1 may be fabricated.

In step S702, an organic light-emitting material layer 3 may be formed on one side of the array substrate 1. The fabrication of the organic light-emitting material layer 3 may be a step during the fabrication of a plurality of display pixels SP. The process for fabricating an organic light-emitting material layer has been described above, and will not be repeated here.

In step S703, a scattering layer 2 may be formed on the side of the organic light-emitting material layer 3 that is far away from the array substrate 1.

In step S704, a packaging cover 5 may be formed. The packaging cover 5 may then be disposed on the side of the scattering layer 2 that is far away from the array substrate 1.

As such, the disclosed display panel and fabrication method are not only applicable to organic light-emitting display panels, but also applicable to organic light-emitting display panels having conventional packaging structures. Therefore, according to the present disclosure, the scattering layer may have a wide range of applications, and can be implemented in various forms.

Figure 22:
FIG. 22 illustrates a schematic block diagram of an exemplary display panel according to some embodiments of the present disclosure.

FIG. 22 illustrates a schematic block diagram of an exemplary display panel according to some embodiments of the present disclosure. Referring to FIG. 22, in one embodiment, the display panel may include a cap layer 6 located between the organic light-emitting material layer 3 and the packaging cover 5. The scattering particles may be doped into the organic material in the cap layer 6 to form the scattering layer 2. That is, the cap layer 6 may be the scattering layer 2.

Figure 23:
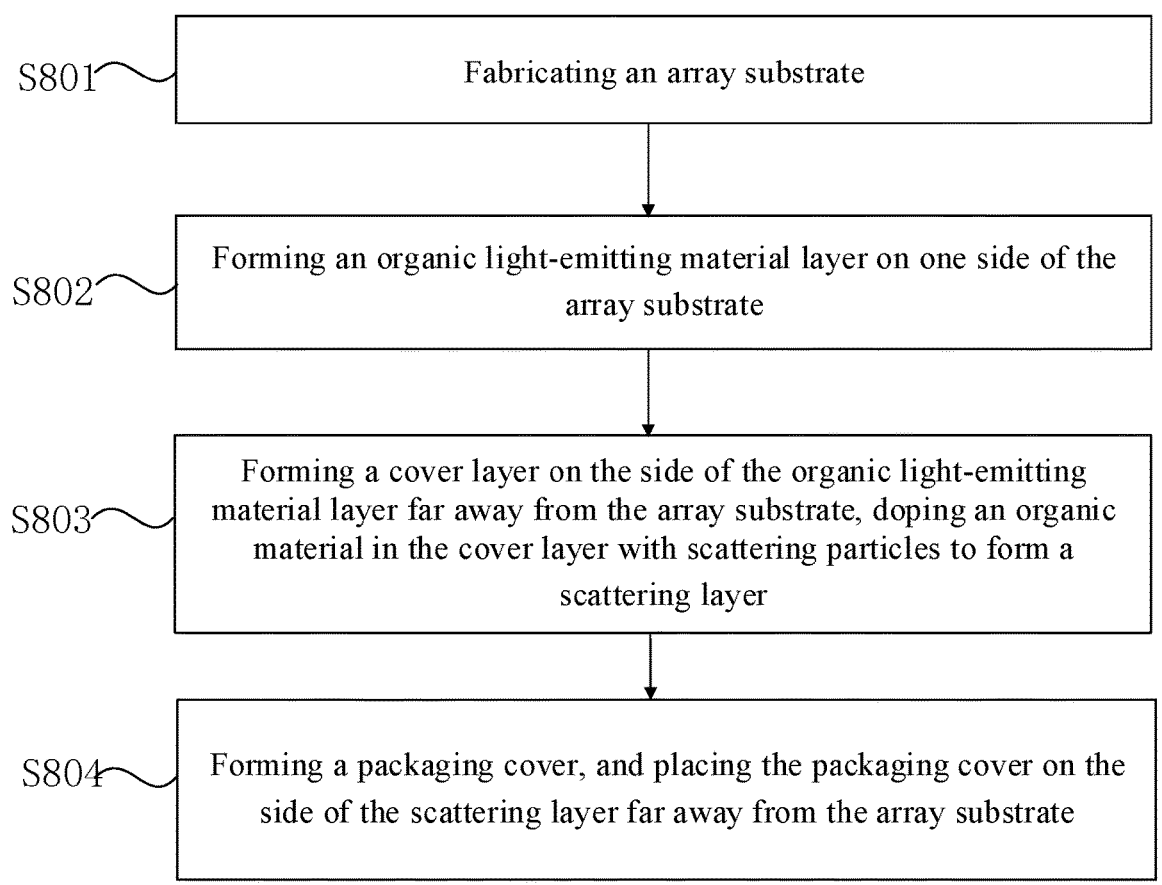
FIG. 23 illustrates a schematic flowchart of another exemplary method for fabricating a display panel according to some embodiments of the present disclosure.
Figure 24:
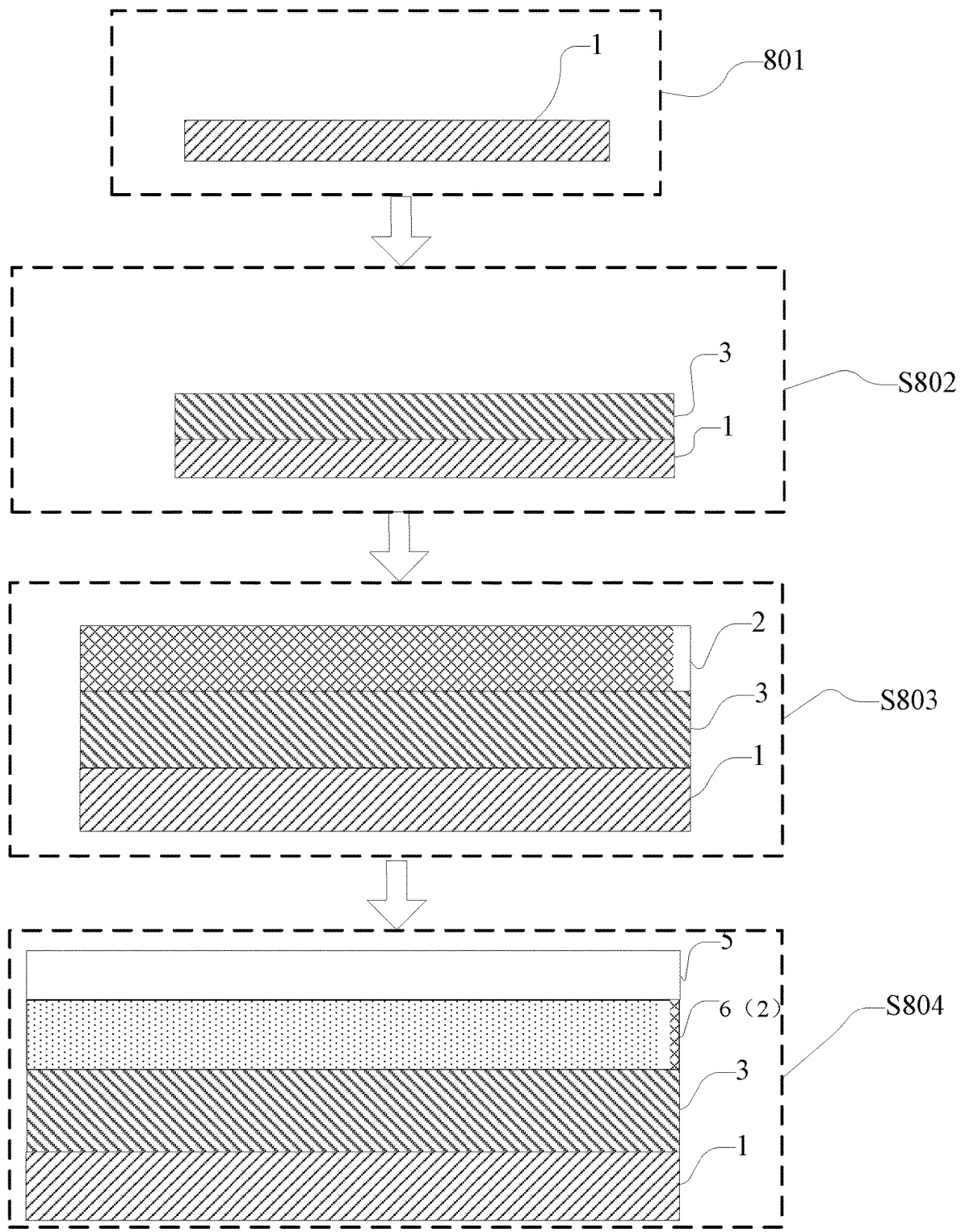
FIG. 24 illustrates schematic views of semiconductor structures at certain stages of another exemplary method for fabricating a display panel according to some embodiments of the present disclosure.

FIG. 23 illustrates a schematic flowchart of another exemplary method for fabricating a display panel according to some embodiments of the present disclosure, and FIG. 24 illustrates schematic views of semiconductor structures at certain stages of the exemplary method. Referring to FIGS. 23-24, the disclosed method for fabricating the display panel may include the following exemplary steps.

In step S801, an array substrate 1 may be fabricated.

In step S802, an organic light-emitting material layer 3 may be formed on one side of the array substrate 1. The fabrication of the organic light-emitting material layer 3 may be a step during the fabrication of a plurality of display pixels SP. The process for fabricating an organic light-emitting material layer has been described above, and will not be repeated here.

In step S803, a cap layer 6 containing an organic material may be formed on the side of the organic light-emitting material layer 3 that is far away from the array substrate 1. A plurality of scattering particles may be doped into the organic material in the cap layer 6 to form the scattering layer 2. That is, the cap layer 6 may be the scattering layer 2.

In step S804, a packaging cover 5 may be formed. The packaging cover 5 may then be disposed on the side of the scattering layer 2 that is far away from the array substrate 1.

Therefore, according to the disclosed display panel and fabrication method, a cap layer may be multiplexed as the scattering layer. Therefore, without changing the existing manufacturing process for display panels, the scattering layer can be obtained by alternating the material only, such that though the scattering layer, the purpose of reducing the zigzag pattern appearing in the display panel may be achieved. As such, the fabrication process may be simple and easy for implementation.

Figure 25:
FIG. 25 illustrates a schematic block diagram of an exemplary display panel according to some embodiments of the present disclosure.

The disclosed display panel and fabrication method can also be applied to liquid crystal display panels. FIG. 25 illustrates a schematic block diagram of an exemplary display panel according to some embodiments of the present disclosure. Referring to FIG. 25, in one embodiment, the disclosed display panel may include a liquid crystal material layer 7 located on one side of the array substrate 1, and a color-film substrate 8 disposed on the side of the liquid crystal material layer 7 that is far away from the array substrate 1. The color-film substrate 8 may include a base substrate 81 and a color-filter layer 82 disposed on the side of the base substrate 81 that is adjacent to the array substrate 1. The scattering layer 2 may be located between the liquid crystal material layer 7 and the base substrate 81.

It should be noted that the color-film substrate 8 may be formed by the base substrate 81, a black matrix (not shown), a color-filter layer 82, and a protective film layer. The black matrix may form a dark region on the display panel, and the dark region may surround a plurality of sub-pixels of the display panel formed at the positions of the plurality of openings. The display panel may include the color-film substrate 8, the liquid crystal material layer 7, and the array substrate 1. Light beams generated by a back-light module may be transmitted upward through the pixel array on the array substrate 1 to the liquid crystal material layer 7. The liquid crystal material layer 7 may change the polarization direction of the light beams. The light beams may then reach the color-film substrate 8. A portion of the light beams may be blocked by the black matrix, and another portion of the light beams may be emitted out from the positions of the sub-pixels. The light beams emitted out may generate colors when passing through the color-filter layer 82. As such, picture display may be implemented.

Figure 26:
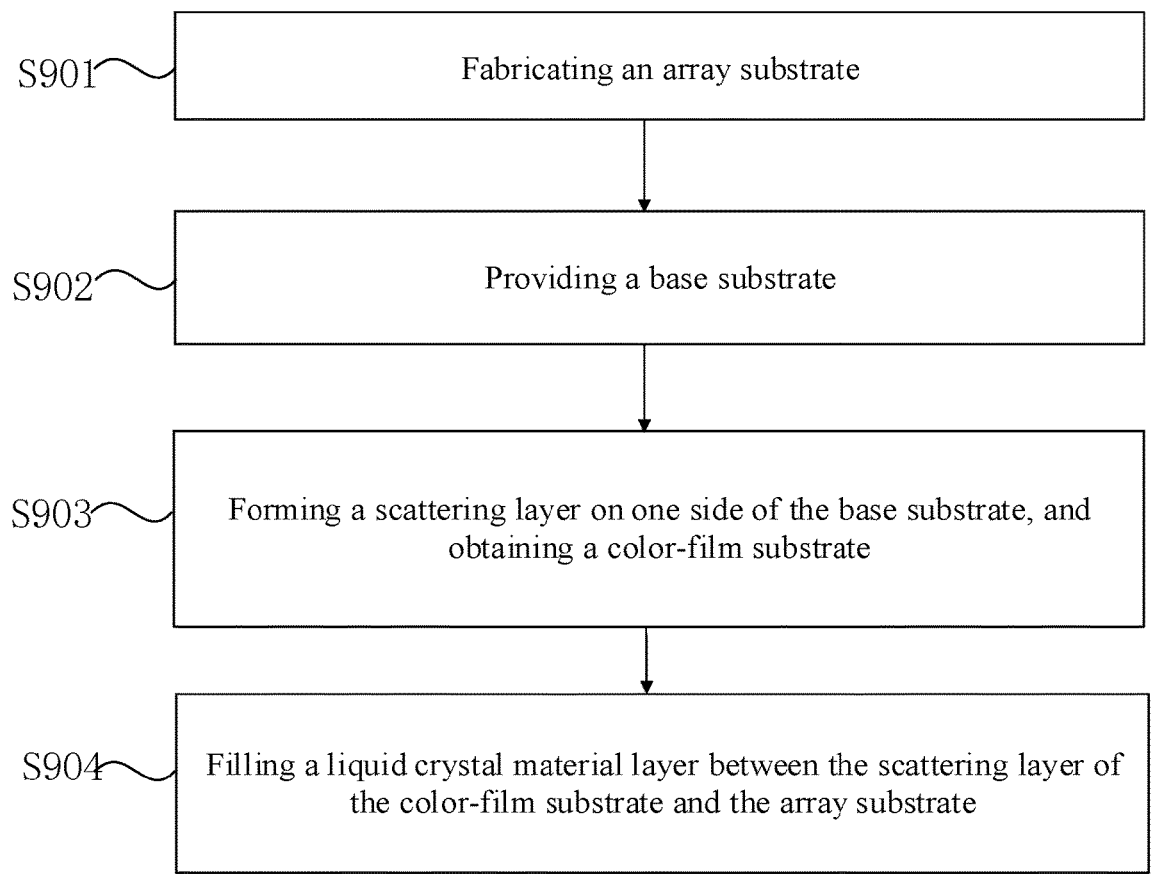
FIG. 26 illustrates a schematic flowchart of another exemplary method for fabricating a display panel according to some embodiments of the present disclosure.
Figure 27:
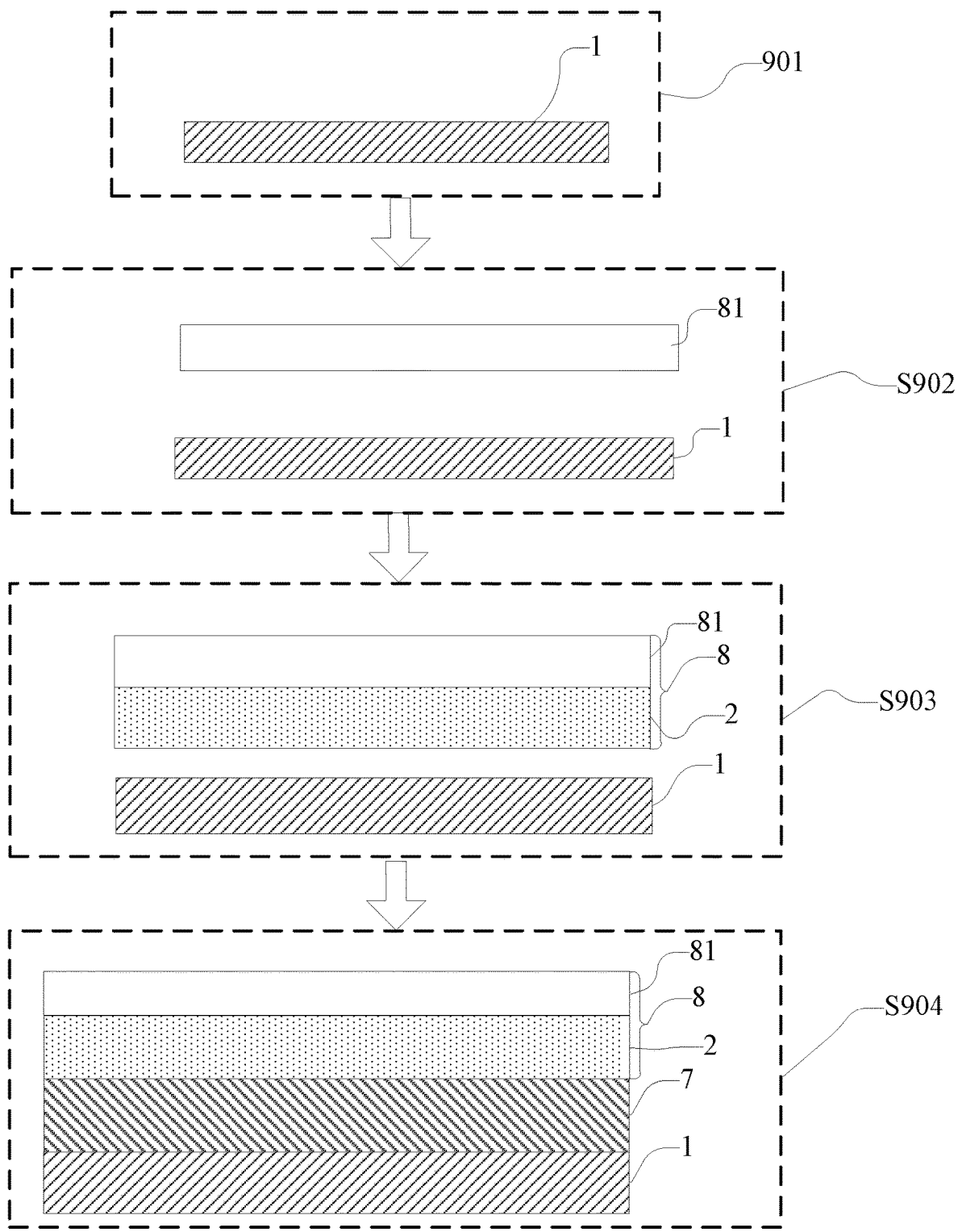
FIG. 27 illustrates schematic views of semiconductor structures at certain stages of another exemplary method for fabricating a display panel according to some embodiments of the present disclosure.

FIG. 26 illustrates a schematic flowchart of another exemplary method for fabricating a display panel according to some embodiments of the present disclosure, and FIG. 27 illustrates schematic views of semiconductor structures at certain stages of the exemplary method. Referring to FIGS. 26-27, the disclosed method for fabricating the display panel may include the following exemplary steps.

In step S901, an array substrate 1 may be fabricated.

In step S902, a base substrate 81 may be provided.

In step S903, a scattering layer 2 may be formed on one side of the base substrate 81 to obtain a color-film substrate 8.

In step S904, a liquid crystal material layer 7 may be filled between the scattering layer 2 of the color-film substrate 8 and the array substrate 1. That is, the scattering layer 2 and the liquid crystal material layer may be located between the base substrate 81 and the array substrate 1.

Therefore, the disclosed display panel and fabrication method are not only applicable to organic light-emitting display panels, but also applicable to liquid crystal display panels. Therefore, according to the present disclosure, the scattering layer may have a wide range of applications, and can be implemented in various forms.

In one embodiment, referring to FIG. 25, the color resist material of the color-filter layer 82 may be doped with scattering particles to form the scattering layer 2.

For example, the disclosed method for fabricating the display panel may include the following exemplary steps.

In step S1001, an array substrate 1 may be fabricated.

In step S1002, a base substrate 81 may be provided.

In step S1003, a plurality of scattering particles may be doped into a color resist material, and a scattering layer 2 and a color-filter layer 82 may be simultaneously formed to obtain a color-film substrate 8. It should be noted that the scattering layer 2 and the color-filter layer 82 may be a same layer, and both may be formed on the side of the base substrate 81 that is adjacent to the array substrate 1.

In step S1004, a liquid crystal material layer 7 may be filled between the scattering layer 2 of the color-film substrate 8 and the array substrate 1. That is, the scattering layer 2 and the liquid crystal material layer may be located between the base substrate 81 and the array substrate 1.

Therefore, the disclosed display panel and fabrication method can also be applied to liquid crystal display panels. According to the disclosed fabrication method, when fabricating the color-filter layer, scattering particles may be simultaneously doped to obtain the scattering layer. As such, the scattering layer and the color-filter layer may be a same layer. Therefore, the fabrication process may be simplified, and the implementation of the fabrication method may be more convenient.

Figure 28:
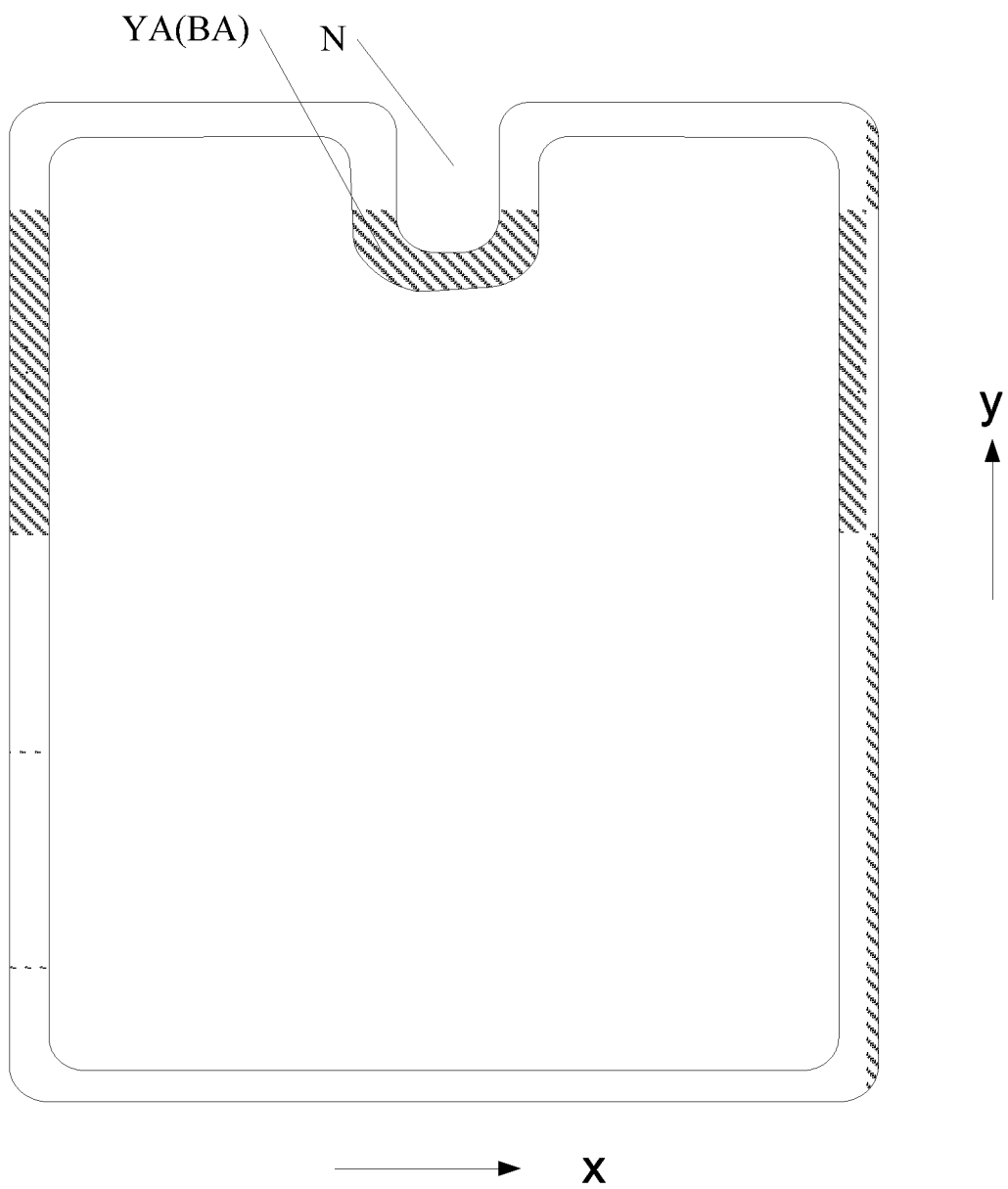
FIG. 28 illustrates a schematic top view of an exemplary display panel according to some embodiments of the present disclosure.

FIG. 28 illustrates a schematic top view of an exemplary display panel according to some embodiments of the present disclosure. Referring to FIG. 28, in one embodiment, the display region AA of the disclosed display panel may have a notch N, and the irregularly-shaped border YA may be adjacent to the notch N.

It should be noted that because the display region AA contains the notch N, with the contrast in pixel display between the region of the notch N and the region adjacent to the irregularly-shaped border YA, the zigzag display phenomenon at the irregularly-shaped border YA may be more evident.

According to the disclosed display panel, the light in an irregularly-shaped region may be more uniform, such that the zigzag display phenomenon may be suppressed and the display of edge patterns may become smoother. Therefore, the pixels in the irregularly-shaped region and the notch region may demonstrate desired display uniformity.

Figure 29:
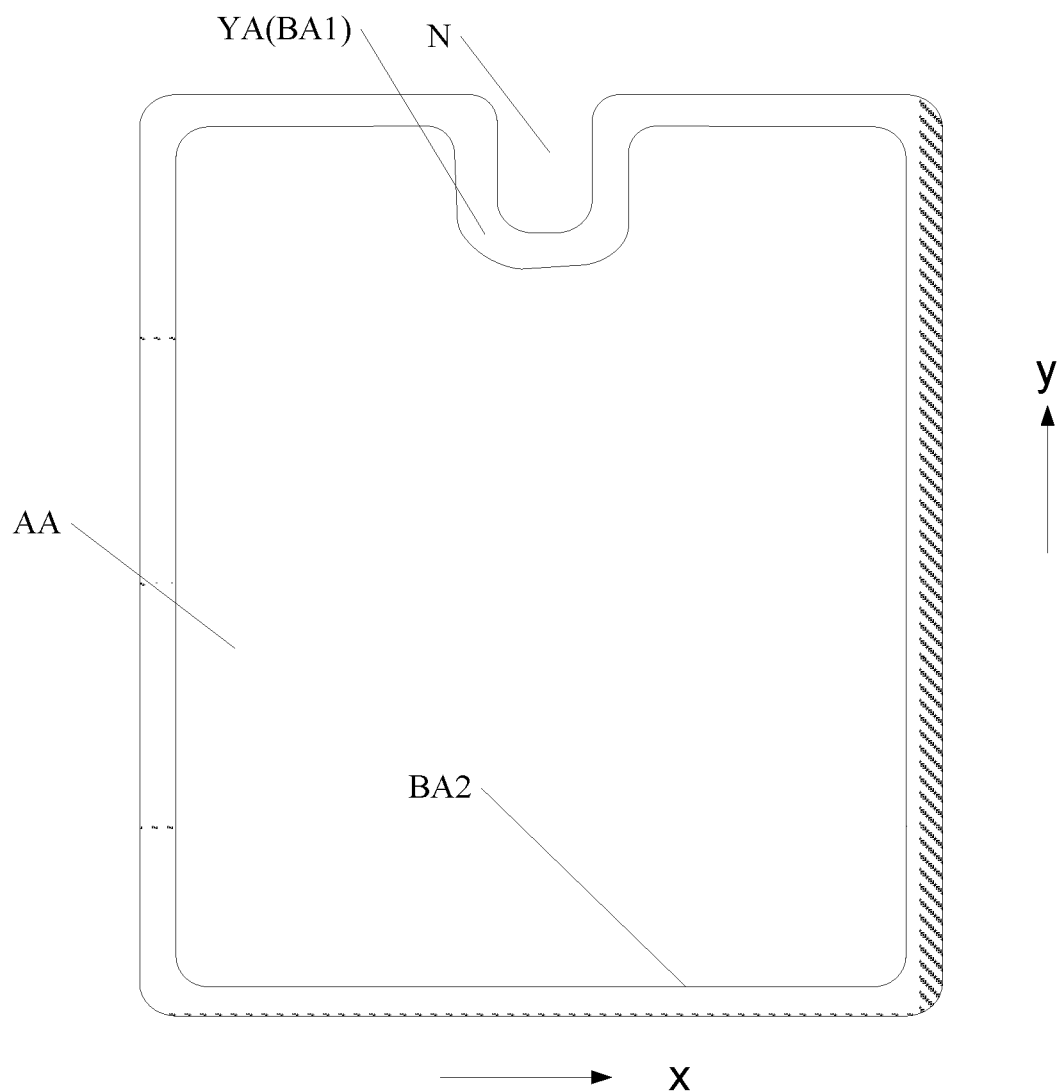
FIG. 29 illustrates another schematic top view of an exemplary display panel according to some embodiments of the present disclosure.

FIG. 29 illustrates another schematic top view of an exemplary display panel according to some embodiments of the present disclosure. Referring to FIG. 29, in one embodiment, the border region BA of the display panel may include a first border BA1 and a second border BA2 arranged in opposite to each other along the second direction y. A notch N may be located on the side of the display region AA adjacent to the first border BA1. The first border BA1 may include the irregularly-shaped border YA.

It should be noted that because the display region AA contains the notch N, with the contrast in pixel display between the region of the notch N and the region adjacent to the irregularly-shaped border YA, the zigzag display phenomenon at the irregularly-shaped border YA may be more evident.

According to the disclosed display panel, the light in an irregularly-shaped region may be more uniform, such that the zigzag display phenomenon may be suppressed and the display of edge patterns may become smoother. Therefore, the pixels in the irregularly-shaped region and the notch region may demonstrate desired display uniformity.

Figure 30:
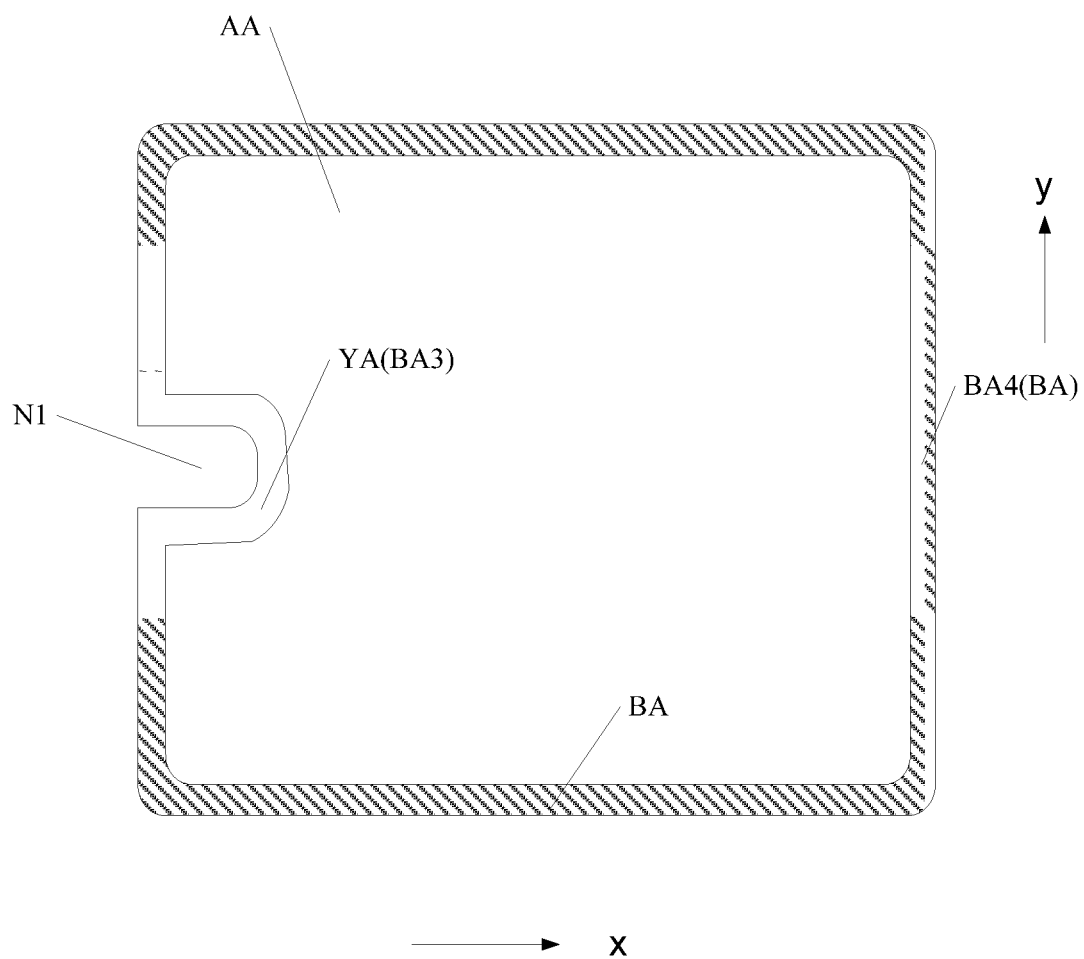
FIG. 30 illustrates another schematic top view of an exemplary display panel according to some embodiments of the present disclosure.

FIG. 30 illustrates another schematic top view of an exemplary display panel according to some embodiments of the present disclosure. Referring to FIG. 30, in one embodiment, the notch N may include a first notch N1. The border region BA of the display panel may include a third border BA3 and a fourth border BA4 arranged in opposite to each other along the first direction x. The first notch N1 may be located on the side of the display region AA adjacent to the third border BA3, and the third border BA3 may include the irregularly-shaped border YA.

It should be noted that because the display region AA contains the notch N1, with the contrast in the pixel display between the region of the notch N1 and the region adjacent to the irregularly-shaped border YA, the zigzag display phenomenon at the irregularly-shaped border YA may be more evident.

According to the disclosed display panel, the light in an irregularly-shaped region may be more uniform, such that the zigzag display phenomenon may be suppressed and the display of edge patterns may become smoother. Therefore, the pixels in the irregularly-shaped region and the notch region may demonstrate desired display uniformity.

Figure 31:
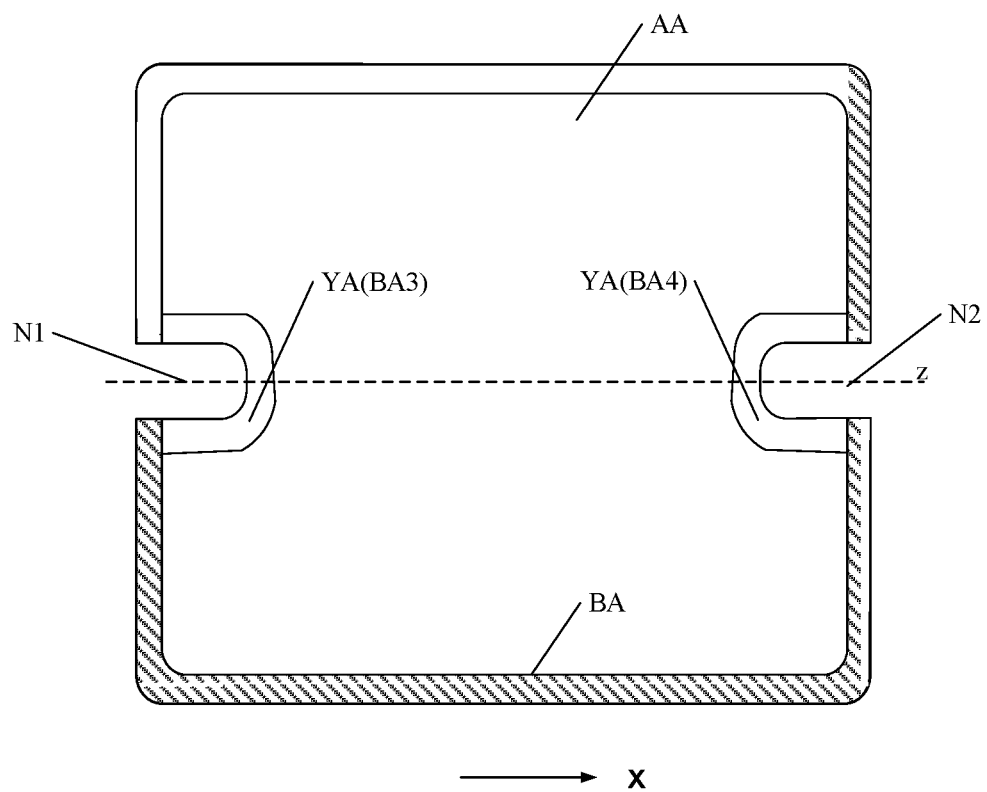
FIG. 31 illustrates another schematic top view of an exemplary display panel according to some embodiments of the present disclosure.

FIG. 31 illustrates another schematic top view of an exemplary display panel according to some embodiments of the present disclosure. Referring to FIG. 31, in one embodiment, the notch N may further include a second notch N2 in addition to the first notch N1. The border region BA of the display panel may include a third border BA3 and a fourth border BA4 arranged in opposite to each other along the first direction x. The first notch N1 may be located on the side of the display region AA adjacent to the third border BA3, and the third border BA3 may include the irregularly-shaped border YA. The second notch N2 may be located on the side of the display region AA adjacent to the fourth border BA4, and the fourth border BA4 may also include the irregularly-shaped border YA. The display panel may be foldable along a folding axis z, and the folding axis z may extend along the first direction x, and may intersect the first notch N1 and the second notch N2 separately.

It should be noted that because the display region AA contains the first notch N1 and the second notch N2, with the contrast in pixel display between the region of the first notch N1 and the second notch N2 and the region adjacent to the irregularly-shaped border YA, the zigzag display phenomenon at the irregularly-shaped border YA may be more evident.

According to the disclosed display panel, the light in an irregularly-shaped region may be more uniform, such that the zigzag display phenomenon may be suppressed and the display of edge patterns may become smoother. Therefore, the pixels in the irregularly-shaped region and the notch region may demonstrate desired display uniformity.

Figure 32:
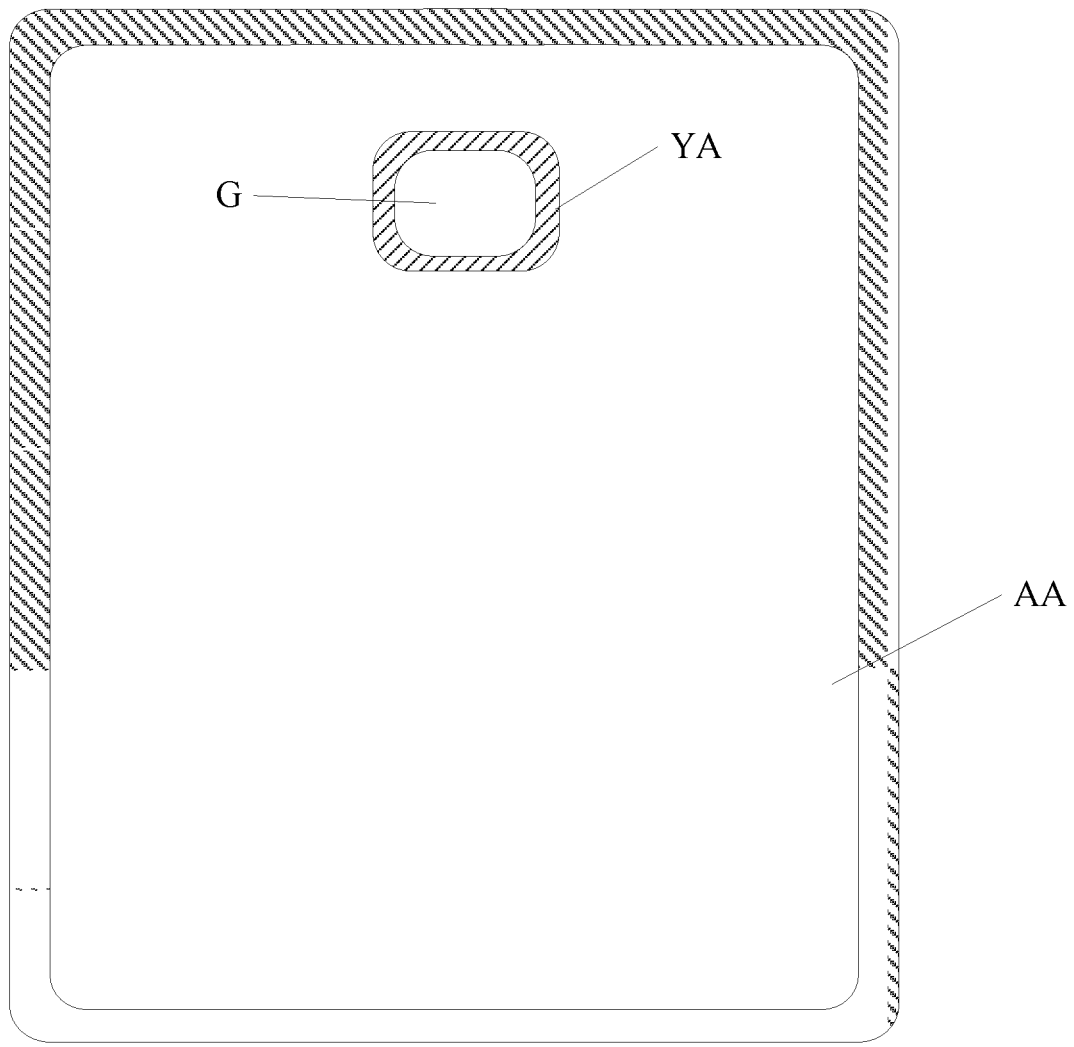
FIG. 32 illustrates another schematic top view of an exemplary display panel according to some embodiments of the present disclosure.

FIG. 32 illustrates another schematic top view of an exemplary display panel according to some embodiments of the present disclosure. Referring to FIG. 32, in one embodiment, the array substrate 1 may include a highly transmitting region G, and the display region AA may surround the highly transmitting region G. The irregularly-shaped border YA may be adjacent to the highly transmitting region G. For example, the highly transmitting region G may be a reserved region for a camera embedded in the display panel.

According to the disclosed display panel, the irregularly-shaped border is arranged adjacent to a highly transmitting region, the pixels of the highly transmitting region and the irregularly-shaped region may demonstrate desired display uniformity.

Figure 33:
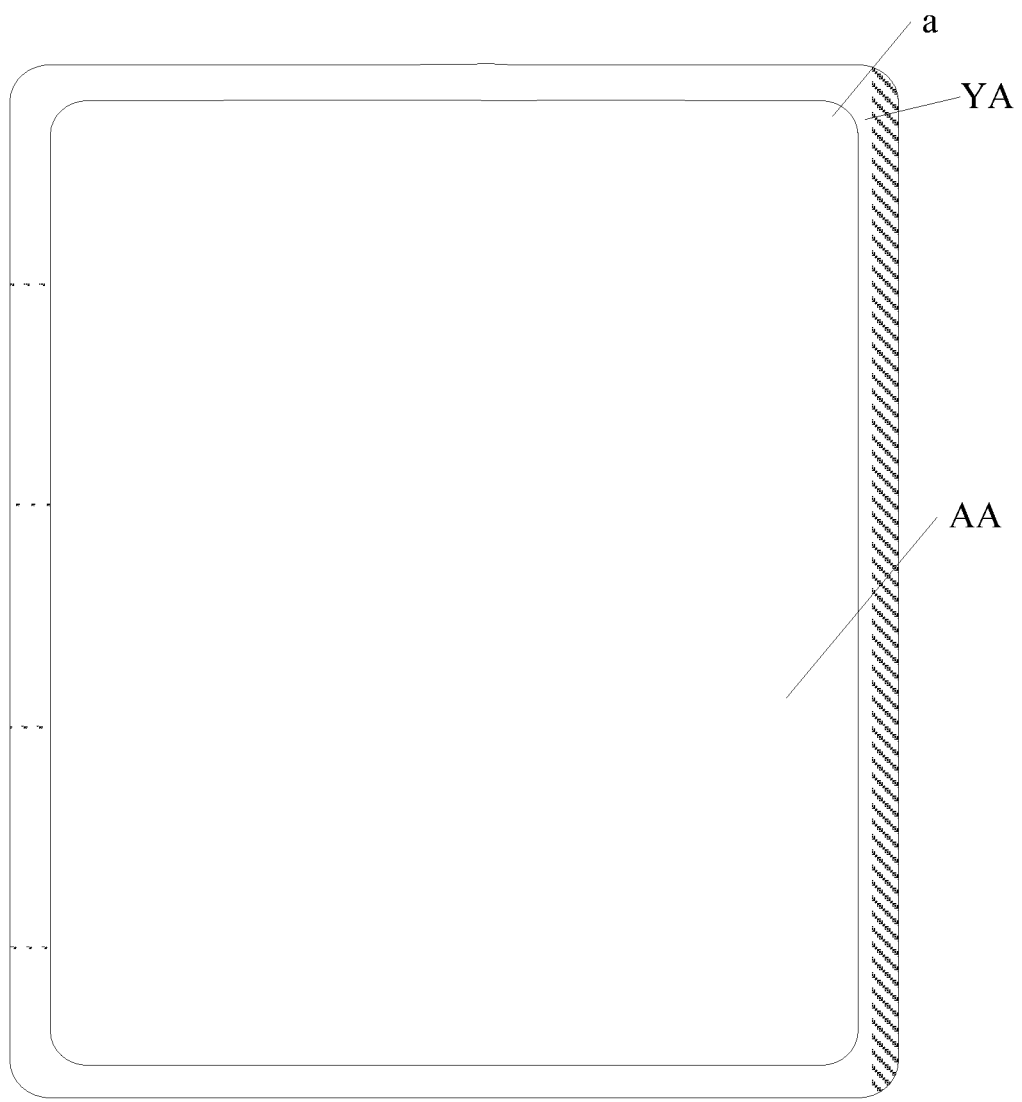
FIG. 33 illustrates another schematic top view of an exemplary display panel according to some embodiments of the present disclosure.

FIG. 33 illustrates another schematic top view of an exemplary display panel according to some embodiments of the present disclosure. Referring to FIG. 33, in one embodiment, the display region AA may have an arc angle a, and the irregularly-shaped border YA may be adjacent to the arc angle a.

According to the disclosed display panel, the irregularly-shaped border is arranged adjacent to an arc angle of the display region, the pixels of the display region adjacent to the arc angle and the irregularly-shaped region may demonstrate desired display uniformity.

Figure 34:
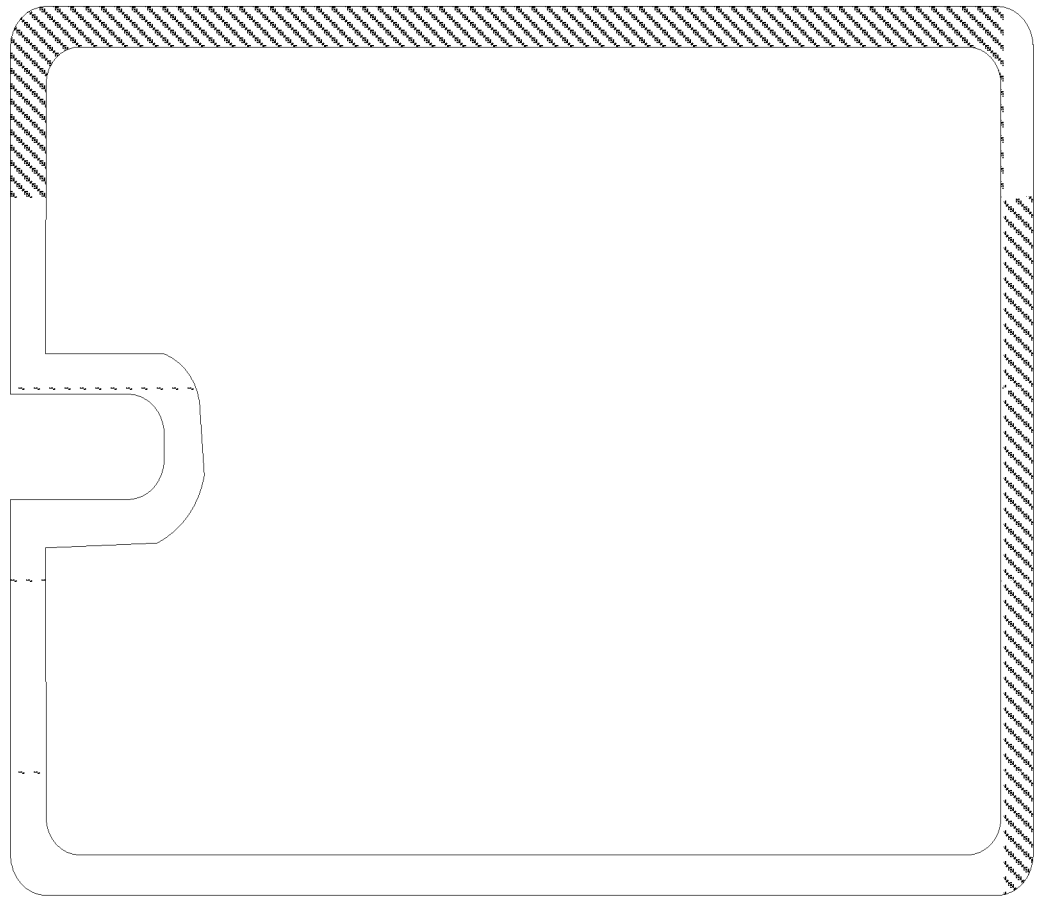
FIG. 34 illustrates a schematic structural diagram of an exemplary display device according to some embodiments of the present disclosure.

Further, the present disclosure also provides a display device. The display device may include an irregularly-shaped display panel according to various embodiments of the present disclosure. FIG. 34 illustrates a schematic structural diagram of an exemplary display device according to some embodiments of the present disclosure. Referring to FIG. 34, the display device may include a disclosed display panel. The display device may also have the technical features and technical effects described above for the display panel, and the details of these features and effects will not be repeated here.

Compared to existing display panel, display device, and fabrication method, the disclosed display panel, display device, and fabrication method may demonstrate the following advantages.

According to the disclosed display panel and display device, by disposing a scattering region on one side of the array substrate, the orthogonal projection of the scattering region on the array substrate can cover at least a portion of the display pixels adjacent to the irregularly-shaped border. As such, light emitted from the display region adjacent to the irregularly-shaped border may be scattered, such that the light in the display region may be more uniform. Therefore, the zigzag display phenomenon may be suppressed, and the display of edge patterns may become smoother.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A display panel, comprising:
an array substrate, including a display region containing a plurality of display pixels, and a border region surrounding the display region, wherein:
the plurality of display pixels includes a plurality of pixel rows extending along a first direction and a plurality of pixel columns extending along a second direction, wherein the first direction and the second direction intersect each other, and
the border region includes an irregularly-shaped border, wherein the plurality of display pixels includes a first plurality of display pixels adjacent to the irregularly-shaped border, and the first plurality of display pixels is located in different pixel rows and different pixel columns;
a scattering layer, located on one side of the array substrate and including a scattering region, wherein:
a plurality of scattering particles is disposed in the scattering region, and
an orthogonal projection of the scattering region on the array substrate covers at least a portion of the first plurality of display pixels adjacent to the irregularly-shaped border,
an organic light-emitting material layer, disposed on the one side of the array substrate;
a cover, disposed on a side of the organic light-emitting material layer far away from the array substrate, wherein:
the scattering layer is located between the organic light-emitting material layer and the cover; and
at least one organic layer, disposed between the organic light-emitting material layer and the cover, wherein:
an organic material of one of the at least one organic layer is doped with the plurality of scattering particles to form the scattering layer.

2. The display panel according to claim 1, wherein:
the orthogonal projection of the scattering region on the array substrate fully covers the first plurality of display pixels adjacent to the irregularly-shaped border, wherein:
an edge of the scattering region in the display region forms a first curve, and
a shortest distance from the first curve to the first plurality of display pixels adjacent to the irregularly-shaped border is larger than 0.1 mm.

3. The display panel according to claim 1, wherein:
the plurality of scattering particles includes one or more of inorganic particles, organic particles, and composite particles; and
a particle size of the plurality of scattering particles is larger than or equal to 20 nm, and smaller than or equal to 100 nm.

4. The display panel according to claim 1, further including:
a thin-film packaging layer, formed on a side of the organic light-emitting material layer far away from the array substrate, wherein:
the thin-film packaging layer has a stacked packaging structure formed by at least one inorganic layer and the at least one organic layer, the at least one inorganic layer including a first inorganic layer that is a furthest layer away from the array substrate among the at least one inorganic layer and the at least one organic layer, and
the scattering layer is disposed between the organic light-emitting material layer and the first inorganic layer.

5. The display panel according to claim 4, wherein:
the scattering layer further includes:
a non-scattering region, wherein:
the non-scattering region is made of a first organic material, and
the scattering region is made of the first organic material doped with the plurality of scattering particles; and
the display panel further includes:
a pixel definition layer, disposed on the one side of the array substrate and including a plurality of opening regions and a non-opening region, wherein:
an organic light-emitting material of the organic light-emitting material layer is located in the plurality of opening regions;
a retaining wall, formed in the non-opening region and on a side of the pixel definition layer far away from the array substrate, wherein:
the retaining wall is located between the non-scattering region and the scattering region; and
a plurality of support pillars, formed in the non-opening region and on the side of the pixel definition layer far away from the array substrate, wherein:
the plurality of support pillars is made of a same material as the retaining wall.

6. The display panel according to claim 1, further including:
a liquid crystal material layer, formed on the one side of the array substrate; and
a color-film substrate formed on a surface of the liquid crystal material layer far away from the array substrate, wherein:
the color-film substrate includes a base substrate and the at least one organic layer located on a side of the base substrate adjacent to the array substrate, the at least one organic layer including a color filter layer.

7. The display panel according to claim 1, wherein:
the display region includes a notch; and
the irregularly-shaped border is adjacent to the notch.

8. The display panel according to claim 7, wherein:
the border region includes a first border and a second border arranged in opposite to each other along the second direction; and
the notch is located on a side of the display region adjacent to the first border, and the first border includes the irregularly-shaped border.

9. The display panel according to claim 7, wherein:
the notch includes a first notch and a second notch;
the border region includes a third border and a fourth border arranged in opposite to each other along the first direction;
the first notch is located on a side of the display region adjacent to the third border, and the third border includes the irregularly-shaped border;
the second notch is located on a side of the display region adjacent to the fourth border, and the fourth border includes the irregularly-shaped border; and
the display panel is foldable along a folding axis, wherein:
the folding axis extends along the first direction, and
the folding axis intersects the first notch and the second notch separately.

10. The display panel according to claim 1, wherein:
the array substrate includes a highly transmitting region, wherein:
the display region surrounds the highly transmitting region, and
the irregularly-shaped border is adjacent to the highly transmitting region.

11. The display panel according to claim 1, wherein:
the display region includes an arc angle, and
the irregularly-shaped border is adjacent to the arc angle.

12. A display device, comprising a display panel according to claim 1.

13. A method for fabricating a display panel, comprising:
forming an array substrate, including a display region and a border region surrounding the display region;
forming a plurality of display pixels in the display region of the array substrate, wherein:
forming the plurality of display pixels on the array substrate includes forming an organic light-emitting material layer on the one side of the array substrate,
the plurality of display pixels includes a plurality of pixel rows extending along a first direction and a plurality of pixel columns extending along a second direction, wherein the first direction and the second direction intersect each other, and
the border region includes an irregularly-shaped border, wherein the plurality of display pixels includes a first plurality of display pixels adjacent to the irregularly-shaped border, and the first plurality of display pixels is located in different pixel rows and different pixel columns;
forming a scattering layer including a scattering region on one side of the array substrate, wherein:
a plurality of scattering particles is disposed in the scattering region, and
an orthogonal projection of the scattering region on the array substrate covers at least a portion of the first plurality of display pixels adjacent to the irregularly-shaped border;
forming a cover on a side of the scattering layer far away from the array substrate, wherein:
the scattering layer is located between the organic light-emitting material layer and the cover; and
disposing at least one organic layer between the organic light-emitting material layer and the cover, wherein:
an organic material of one of the at least one organic layer is doped with the plurality of scattering particles to form the scattering layer.

14. The method according to claim 13, wherein:
after forming the organic light-emitting material layer, the method further includes forming a thin-film packaging layer on a side of the organic light-emitting material layer far away from the array substrate, wherein:
the thin-film packaging layer has a stacked packaging structure formed by at least one inorganic layer and the at least one organic layer, the at least one inorganic layer including a first inorganic layer that is a furthest layer away from the array substrate among the at least one inorganic layer and the at least one organic layer; and
forming the thin-film packaging layer includes forming the scattering layer between the organic light-emitting material layer and the first inorganic layer.

15. The method according to claim 14, wherein the scattering layer also includes a non-scattering region, and doping one of the at least one organic layer with the plurality of scattering particles to form the scattering layer includes:
using a first organic material to form the non-scattering region; and
using the first organic material doped with the plurality of scattering particles to form the scattering region.

16. The method according to claim 15, wherein:
forming the organic light-emitting material layer on the one side of the array substrate includes forming a pixel definition layer on the one side of the array substrate, the pixel definition layer including a plurality of opening regions and a non-opening region, wherein an organic light-emitting material is formed in the plurality of opening regions;
after forming the organic light-emitting material layer, and prior to forming the thin-film packaging layer, the method further includes forming a retaining wall in the non-opening region and on a side of the pixel definition layer far away from the array substrate, wherein the retaining wall is located between the non-scattering region and the scattering region;
using the first organic material to form the non-scattering region includes performing a first printing process on the non-scattering region using the first organic material, wherein the retaining wall prevents the first organic material from entering the scattering region; and
using the first organic material doped with the plurality of scattering particles to form the scattering region includes performing a second printing process on the scattering region using the first organic material doped with the plurality of scattering particles, wherein the retaining wall prevents the first organic material doped with the plurality of scattering particles from entering the non-scattering region.

17. The method according to claim 16, wherein:
after forming the organic light-emitting material layer, and prior to forming the thin-film packaging layer, the method further includes forming a plurality of support pillars in the non-opening region and on the side of the pixel definition layer far away from the array substrate, wherein:

the plurality of support pillars is formed in a same process with the retaining wall.

18. The method according to claim 13, wherein:
forming the scattering layer on the one side of the array substrate includes forming the scattering layer on a side of the organic light-emitting material layer far away from the array substrate.

19. The method according to claim 13, further including:
forming a color-film substrate, wherein:
   forming the color-film substrate includes providing a base substrate, and forming the scattering layer on one side of the base substrate; and
forming the plurality of display pixels on the array substrate includes filling a liquid crystal material layer between the scattering layer of the color-film substrate and the array substrate, wherein:
   forming the scattering layer on the one side of the base substrate includes doping the plurality of scattering particles into a color resist material to simultaneously form the scattering layer and a color-filter layer.

20. A display panel, comprising:
an array substrate, including a display region containing a plurality of display pixels, and a border region surrounding the display region, wherein:
   the plurality of display pixels includes a plurality of pixel rows extending along a first direction and a plurality of pixel columns extending along a second direction, wherein the first direction and the second direction intersect each other, and
   the border region includes an irregularly-shaped border, wherein the plurality of display pixels includes a first plurality of display pixels adjacent to the irregularly-shaped border, and the first plurality of display pixels is located in different pixel rows and different pixel columns; and
a scattering layer, located on one side of the array substrate and including a scattering region, wherein:
   a plurality of scattering particles is disposed in the scattering region, and
   an orthogonal projection of the scattering region on the array substrate covers at least a portion of the first plurality of display pixels adjacent to the irregularly-shaped border,
wherein:
the display panel further includes:
   an organic light-emitting material layer, disposed on the one side of the array substrate; and
   a thin-film packaging layer, formed on a side of the organic light-emitting material layer far away from the array substrate, wherein:
      the thin-film packaging layer has a stacked packaging structure formed by at least one inorganic layer and at least one organic layer, the at least one inorganic layer including a first inorganic layer that is a furthest layer away from the array substrate among the at least one inorganic layer and the at least one organic layer,
      the scattering layer is disposed between the organic light-emitting material layer and the first inorganic layer, and
      one of the at least one organic layer is doped with the plurality of scattering particles to form the scattering layer,
the display panel further includes:
   an organic light-emitting material layer, disposed on the one side of the array substrate;
   a packaging cover, disposed on a side of the organic light-emitting material layer far away from the array substrate, wherein:
      the scattering layer is located between the organic light-emitting material layer and the packaging cover; and
   a cap layer, disposed between the organic light-emitting material layer and the packaging cover, wherein:
      an organic material of the cap layer is doped with the plurality of scattering particles to form the scattering layer,
or the display panel further includes:
   a liquid crystal material layer, formed on the one side of the array substrate; and
   a color-film substrate formed on a surface of the liquid crystal material layer far away from the array substrate, wherein:
      the color-film substrate includes a base substrate and a color-filter layer located on a side of the base substrate adjacent to the array substrate, and
      a color resist material of the color-filter layer is doped with the plurality of scattering particles to form the scattering layer.

* * * * *